US009287280B2

(12) United States Patent
Tsao et al.

(10) Patent No.: US 9,287,280 B2
(45) Date of Patent: Mar. 15, 2016

(54) METHOD TO IMPROVE MEMORY CELL ERASURE

(71) Applicant: Taiwan Semiconductor Manufacturing Co., Ltd., Hsin-Chu (TW)

(72) Inventors: Tsun-Kai Tsao, Tainan (TW); Yong-Shiuan Tsair, Tainan (TW); Hung-Ling Shih, Tainan (TW); Po-Wei Liu, Tainan (TW); Wen-Tuo Huang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 61 days.

(21) Appl. No.: 14/326,562

(22) Filed: Jul. 9, 2014

(65) Prior Publication Data

US 2016/0013195 A1    Jan. 14, 2016

(51) Int. Cl.
*H01L 21/336* (2006.01)
*H01L 27/115* (2006.01)
*H01L 29/423* (2006.01)
*H01L 29/788* (2006.01)
*H01L 29/66* (2006.01)
*H01L 21/28* (2006.01)
*H01L 21/768* (2006.01)
*H01L 23/528* (2006.01)
*H01L 21/3213* (2006.01)

(52) U.S. Cl.
CPC .... *H01L 27/11521* (2013.01); *H01L 21/28273* (2013.01); *H01L 21/32135* (2013.01); *H01L 21/768* (2013.01); *H01L 23/528* (2013.01); *H01L 29/42328* (2013.01); *H01L 29/6656* (2013.01); *H01L 29/66825* (2013.01); *H01L 29/788* (2013.01)

(58) Field of Classification Search
CPC ............ H01L 21/768; H01L 21/28273; H01L 21/32135; H01L 23/528; H01L 27/11521; H01L 29/42328; H01L 29/6656; H01L 29/66825; H01L 29/788
USPC .......................... 438/211, 257, 259, 260, 266
See application file for complete search history.

(56) References Cited

U.S. PATENT DOCUMENTS

| | | | |
|---|---|---|---|
| 7,329,578 B2 | 2/2008 | Wei | |
| 2005/0127428 A1* | 6/2005 | Mokhlesi | H01L 27/115 257/315 |
| 2006/0170029 A1 | 8/2006 | Liu et al. | |
| 2006/0278916 A1* | 12/2006 | Iino | H01L 21/28273 257/315 |
| 2008/0012061 A1* | 1/2008 | Ichige | H01L 21/28273 257/315 |
| 2008/0265304 A1* | 10/2008 | Lee | H01L 21/28273 257/316 |
| 2012/0243339 A1* | 9/2012 | Seo | G11C 16/0425 365/185.29 |

* cited by examiner

*Primary Examiner* — Kevin M Picardat
(74) *Attorney, Agent, or Firm* — Eschweiler & Associates, LLC

(57) ABSTRACT

A semiconductor structure of a split gate flash memory cell is provided. The semiconductor structure includes a semiconductor substrate that includes a first source/drain region and a second source/drain region. The semiconductor structure further includes an erase gate located over the first source/drain region, and a word line and a floating gate located over the semiconductor substrate between the first and second source/drain regions. The floating gate is arranged between the word line and the erase gate. Further, the floating gate includes a pair of protrusions extending vertically up from a top surface of the floating gate and arranged on opposing sides, respectively, of the floating gate. A method of manufacturing the semiconductor structure using a high selectively etch recipe, such as an etch recipe comprised of primarily hydrogen bromide (HBr) and oxygen, is also provided.

20 Claims, 25 Drawing Sheets

METHOD TO IMPROVE MEMORY CELL ERASURE

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cells, typically made from floating gate transistors. Common types of flash memory cells include stacked gate memory cells and split gate memory cells (e.g., the third generation SUPERFLASH (ESF3) memory cell). Split gate memory cells have several advantages over stacked gate memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
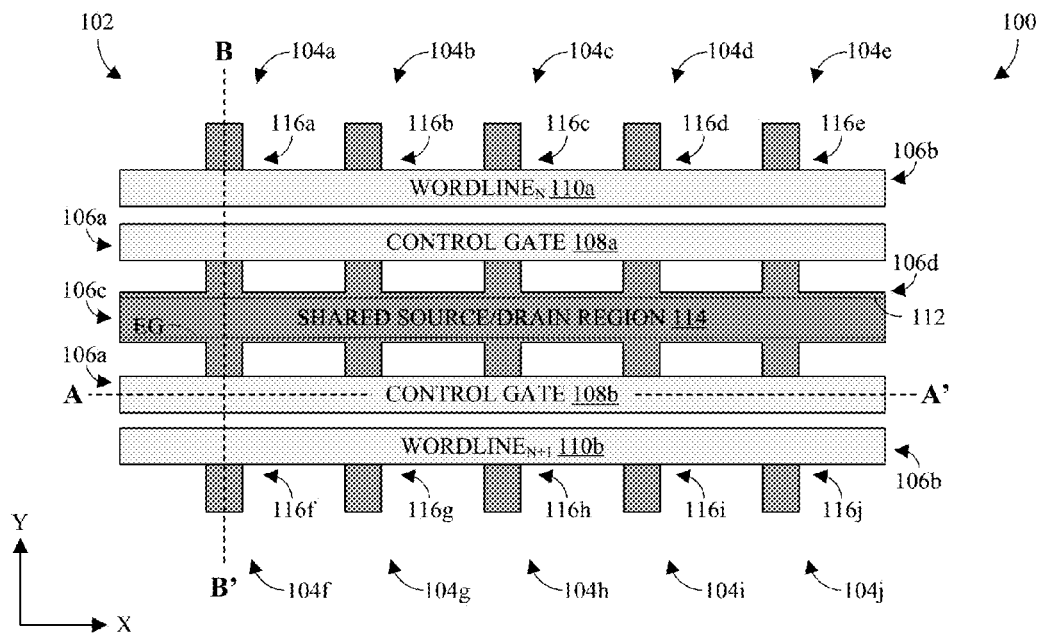
FIG. 1 illustrates a top view of several layers included in some embodiments of a semiconductor structure of an array of split gate flash memory cells, the semiconductor structure employing floating gates with protrusions.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Split gate flash memory cells are semiconductor devices, typically formed as part of integrated circuits. A semiconductor structure for a split gate flash memory cell includes a word line and a floating gate spaced on a semiconductor substrate between a pair of source/drain regions embedded in the semiconductor substrate. Further, an erase gate is located over a source/drain region of the pair, and the floating gate is located between the erase gate and the word line. Dielectrics are arranged between the semiconductor substrate, the word line, the floating gate and the erase gate, and a control gate is arranged over the floating gate with a dielectric arranged therebetween. In operation, the floating gate stores a variable amount of charge corresponding to a binary value. Through selective biasing of the erase and control gates, as well as through selective biasing of the word lines, the amount of stored charge and the binary value can be varied.

The speed with which a split gate flash memory cell is erased is an important criterion for the performance of the split gate flash memory cell. To erase a split gate flash memory cell, a high voltage is applied to the erase gate. This voltage is high relative to the voltages applied to the control gate, the word line, and across the source/drain regions. The high voltage promotes charge (e.g., electrons) stored in the floating gate to tunnel (Fowler-Nordheim tunneling) from the floating gate to the erase gate through the dielectric arranged between the erase and floating gates. As a result of this tunneling, the charge stored in the floating gate is removed and the split gate flash memory cell is erased. Hence, erase speed can be increased by increasing the speed with which electrons tunnel to the erase gate.

One approach to improve the speed of tunneling is to increase voltage applied to the floating gate. This increases the strength of the electric field within the floating gate and increases the occurrence of Fowler-Nordheim tunneling. However, this approach wastes power and generates additional heat. Another approach to improve the speed of tunneling is to generate protrusions or tips peripherally along the top surface of the floating gate. The electric field generated by the high voltage applied to the erase gate concentrates in the protrusions with increasing degree depending upon the sharpness and height of the protrusions. The sharper and/or higher the protrusions, the greater the concentration of the electric field. With the increased concentration of the electric field, Fowler-Nordheim tunneling more readily occurs in the protrusions and the tunneling speed increases.

Despite the benefits of protrusions, traditional methods for forming split gate flash memory cells of the type described above (e.g., the third generation SUPERFLASH (ESF3) memory cell) do not form protrusions. The traditional approaches use a low selectivity etch recipe to control the thickness of the floating gate. For example, a low selectivity etch recipe comprised primarily of tetrafluoromethane ($CF_4$) and difluoromethane ($CH_2F_2$) is used. The low selectivity etch recipe removes or otherwise dulls any protrusions of the floating gate layer to form a roughly planar top surface. Further, the traditional methods for forming split gate flash memory cells do not subsequently form protrusions.

In view of the foregoing, the present application is directed to a semiconductor structure of the type described above that includes protrusions and a method of forming the same. In some embodiments, the method forms these protrusions using a high selectivity etch recipe comprised of hydrogen bromide (HBr) and oxygen, such as diatomic oxygen ($O_2$). The high selectivity etch recipe is applied to a polysilicon floating gate layer buried in a top surface of an oxide dielectric. The high selectivity etch recipe etches the polysilicon floating gate layer to form recesses in the top surface thereof, while minimally etching the oxide dielectric. The oxide dielectric is then recessed relative to the polysilicon floating gate layer to expose protrusions, and floating gates are subsequently formed from the remaining polysilicon floating gate layer. The protrusions advantageously increase the speed of Fowler-Nordheim tunneling to increase the speed of erases. Further, the protrusions advantageously allow power savings since the same erase speed can be achieved with a lower erase voltage (e.g., 0.9 volts (V) to 1.3V less).

With reference to FIG. 1, a top view 100 of some embodiments of a semiconductor structure of an array 102 of split gate flash memory cells 104a-j is provided. The top view 100 illustrates the layout of several layers 106a-d, but not all layers, included in the semiconductor structure of the array 102. For illustrative purposes, the array 102 includes 5 columns and 2 rows of split gate flash memory cells 104, but it is to be understood that more or less columns and/or more or less rows are amenable. The array 102 need only include a single row and a single column. Further, the rows are typically formed in pairs, so it's common for the array 102 to include an even number of rows.

The layers 106 include a control gate layer 106a that includes control gates 108a, 108b of the split gate flash memory cells 104 of the array 102, a wordline layer 106b that includes wordlines 110a, 110b of the split gate flash memory cells 104 of the array 102, and an erase gate layer 106c that includes erase gates 112 of the split gate flash memory cells 104 of the array 102. In some embodiments, as shown, each row of the array 102 includes a control gate 108, an erase gate 112, and/or a wordline 110 shared by all the split gate flash memory cells 104 of the row. In other embodiments, however, each cell can have a separately assertable control gate 108, erase gate 112, and/or wordline 110 rather than the control gate 108, erase gate 112, and/or wordline 110 being shared for all cells of a row.

Further, the layers 106 include an oxide diffusion (or active) layer 106d. The oxide diffusion layer 106d includes source/drain regions 114. In some embodiments, as shown, the oxide diffusion layer 106d includes a source/drain region 114 shared by the split gate flash memory cells 104 of each pair of rows, and source/drain regions (not shown) individual to the split gate flash memory cells 104 of the array 102. Further, the oxide diffusion layer 106d includes channel regions 116a-j individual to the split gate flash memory cells 104 of the array 102 and formed between the source/drain regions 114.

Figure 2A:
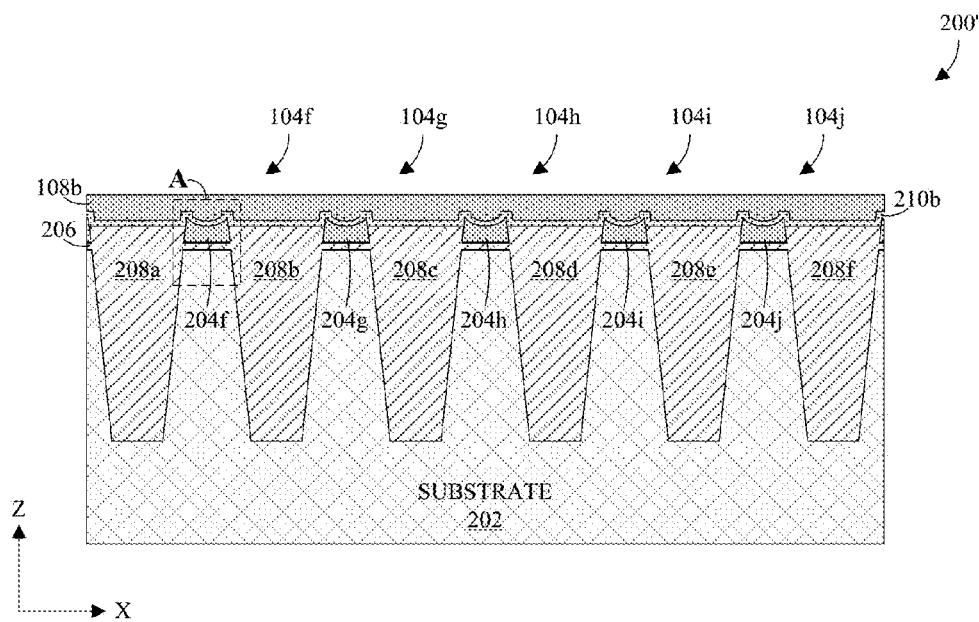
FIG. 2A illustrates a cross-sectional view of some embodiments of the semiconductor structure of FIG. 1 along line A-A'.

With reference to FIG. 2A, a cross-sectional view 200' of some embodiments of the semiconductor structure along line A-A' of FIG. 1 is provided. The cross-sectional view 200' illustrates a specific row of the array 102 (i.e., split gate flash memory cells 104f-j), but it is to be understood that the cross-sectional view 200' is illustrative of other rows in the array 102.

The semiconductor structure includes a semiconductor substrate 202. The semiconductor substrate 202 is n- or p-type, and can, for example, be a bulk silicon substrate or a silicon-on-insulator (SOI) substrate. If present, an SOI substrate is often made up of an active layer of high quality silicon in which the split gate flash memory cells 104 are formed. In such instances, the split gate flash memory cells 104 are arranged over a buried layer (BOX) of electrically insulating silicon dioxide, which is arranged over a bulk silicon support substrate. Typically, the semiconductor substrate 202 is planar with a uniform thickness. Over a top surface, typically a planar top surface, of the semiconductor substrate 202, the semiconductor structure includes floating gates 204f-j (one for each split gate flash memory cell 104 of the row) spaced along the length of the semiconductor substrate 202. The floating gates 204 are typically formed of polysilicon, but other conductive materials are amenable.

Figure 3:
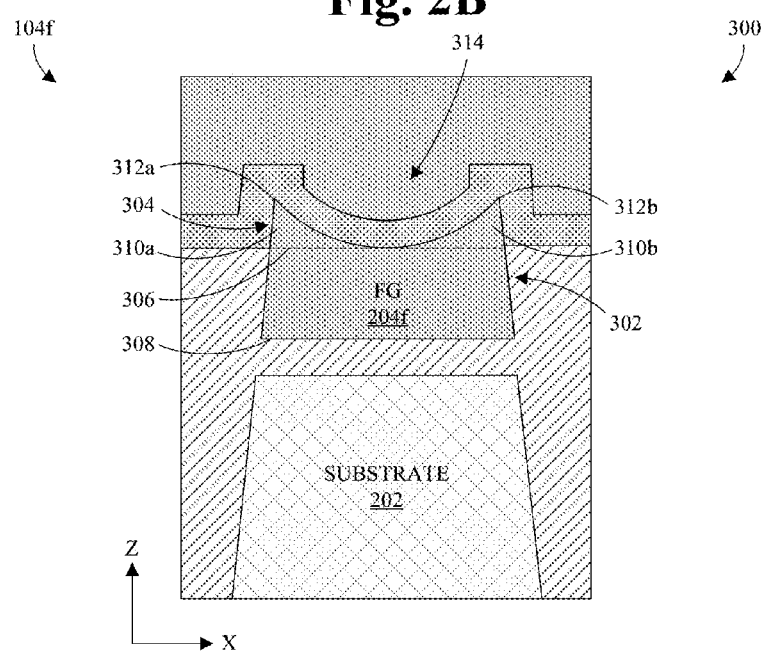
FIG. 3 illustrates an enlarged cross-sectional view of some embodiments of the semiconductor structure of FIG. 1 along a portion of line A-A'.

With reference to FIG. 3, an enlarged cross-sectional view 300 of some embodiments of portions of the semiconductor structure highlighted by rectangle A of FIG. 2A is provided. Rectangle A of FIG. 2A corresponds to a specific split gate flash memory cell 104f, but it is to be understood that the cross-sectional view is illustrative of other split gate flash memory cells 104 in the array 102.

The floating gate 204f of the split gate flash memory cell 104f includes a base region 302 and a protruding region 304 resting atop the base region 302. The base region 302 includes a profile being approximately rectangular in shape with a top surface 306 (or interface between the protruding and base regions 302, 304) and a bottom surface 308 running parallel to the top surface 306, and typically parallel to a top surface of the semiconductor substrate 202. For example, the profile of the base region 302 can be an isosceles trapezoid increasing in width towards the bottom surface 308. The protruding region 304 includes a profile having a pair of protrusions 310a, 310b arranged on opposing sides of the floating gate 204 and culminating to points or tips 312a, 312b on the opposing sides. Sidewalls of the protrusions within a central region 314 between the protrusions 310 typically arc gradually with increasing slope to the points or tips 312, whereas sidewalls of the protrusions 310 outside the central region 314 typically run coplanar with the sidewalls of the base region 302. Further, the protrusions 310 typically have a height of between 20 Angstroms (A) and 180 A, as measured from the top surface 306. Advantageously, the protrusions 310 increase the speed of Fowler-Nordheim tunneling during erases of the split gate flash memory cell 104, thereby increasing erase speed. Further, the protrusions 310 advantageously allow power savings since the same erase speed can be achieved with a lower erase voltage (e.g., 0.9 volts (V) to 1.3V less).

Referring back to FIG. 2A, arranged between the floating gates 204 and the semiconductor substrate 202, the semiconductor structure includes a base dielectric region 206. The base dielectric region 206 is, for example, silicon dioxide and isolates the floating gates 204 from the semiconductor substrate 202. Further, arranged between the split gate flash memory cells 104, the semiconductor structure includes a plurality of isolation regions 208a-f. The isolation regions 208 extend vertically down from approximately even with top surfaces of the floating gates 204 (e.g., from top surfaces 306 of base regions 302 of the floating gates 204), through the base dielectric region 206, and into the semiconductor substrate 202. The isolation regions 208 can manifest as, for example, a deep trench isolation (DTI) region and/or a shallow trench isolation region (STI). A DTI region and/or STI region typically manifests as a dielectric region, such as silicon dioxide region, buried in the semiconductor substrate 202.

Arranged over the floating gates 204, the semiconductor structure includes a control gate 108b. As shown, the split gate flash memory cells 104 share the control gate 108. However, in other embodiments, the split gate flash memory cells 104 include individual control gates. As with the floating gates 204, the control gate 108 is typically formed of polysilicon, but other conductive materials are amenable. Further, interposed between the floating gates 204 and the control gate 108, the semiconductor structure includes an inter-gate dielectric region 210b. The inter-gate dielectric region 210b conformally lines a top surface of the isolation regions 208, as well as exposed surfaces of the floating gates 204 (e.g., surfaces of the protrusion regions 304 of the floating gates 204). The inter-gate dielectric region 210b is typically an oxide-nitride-oxide (ONO) dielectric, but other dielectrics are amenable.

Figure 2B:
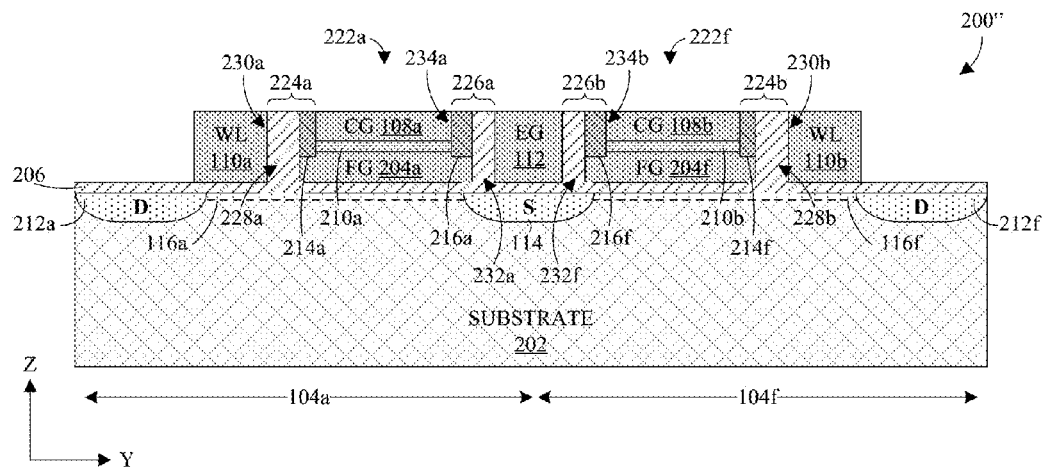
FIG. 2B illustrates a cross-sectional view of some embodiments of the semiconductor structure of FIG. 1 along line B-B'.

With reference to FIG. 2B, a cross-sectional view 200" of some embodiments of the semiconductor structure along line B-B' of FIG. 1 is provided. The cross-sectional view 200" corresponds to a specific column of the array 102 (i.e., split gate flash memory cells 104a, 104f), but it is to be understood that the cross-sectional view 200" is illustrative of other columns in the array 102. Further, the cross-sectional view 200" corresponds to a single pair of split gate flash memory cells 104a, 104f, but it is to be understood that the cross sectional view 200" is illustrative of other pairs of split gate flash memory cells.

As noted above, the semiconductor structure includes a semiconductor substrate 202. Embedded within a top surface of the semiconductor substrate 202, the semiconductor structure includes a source/drain region 114 shared by the split gate flash memory cells 104 of the pair and two source/drain regions 212a, 212f individual to the split gate flash memory cells 104 of the pair. The shared and individual source/drain regions 114, 212 are of the same type (i.e., n- or p-type) and of the opposite type as the semiconductor substrate 202. Alternatively, the shared and individual source/drain regions 114, 212 are of opposite type as a well region or active region in which the split gate flash memory cells 104 are formed. The shared and individual source/drain regions 114, 212 are spaced to define a channel region 116a, 116f between each individual source/drain region 212 and the shared source/drain region 114. The channel regions 116 correspond to the different split gate flash memory cells 104 of the pair.

Over each channel region 116, the semiconductor structure includes a floating gate 204a, 204f. In some embodiments, the floating gate 204 may be symmetrical about an axis running perpendicular to the surface of the semiconductor substrate 202. Further, the floating gate 204 may be recessed proximate to the individual source/drain region 212 to define a peripheral floating gate ledge 214a, 214f, and recessed proximate to the shared source/drain region 114 to define a central floating gate ledge 216a, 216f. The peripheral and central floating gate ledges 214, 216 exhibit a reduced height relative to atop surface of the floating gate 204 and run along opposing floating gate edges facing the individual source/drain region 212 and the shared source/drain region 114, respectively. In this way, the floating gate 204 has a symmetrical, stepped appearance when viewed in profile.

Spaced between the floating gates 204 and arranged over the shared source/drain region 114 and, the semiconductor structure includes an erase gate 112 shared by the split gate flash memory cells 104. Further, adjacent to or partially over each individual source/drain region 212, and spaced between the individual source/drain region 212 and the floating gate 204, the semiconductor structure includes a word line 110a, 110b. Moreover, disposed between the semiconductor substrate 202 and the floating and erase gates 204, 112, as well as between the semiconductor substrate 202 and the word lines 110, the semiconductor structure includes a base dielectric region 206, such as silicon dioxide, to electrically isolate the floating and erase gates 204, 112, as well as the word lines 110, from the semiconductor substrate 202.

Over the top surface of each floating gate 204, the semiconductor structure includes a control gate 108a, 108b and an inter-gate dielectric region 210a, 210b. The inter-gate dielectric region 210 is interposed between the control gate 108 and the floating gate 204 to electrically isolate the floating gate 204 from the control 108. The inter-gate dielectric region 210 is typically an ONO dielectric, but other types of dielectrics can be used in place of the ONO dielectric.

Each floating gate 204, its corresponding control gate 108, and its corresponding inter-gate dielectric region 210 form a stack 222a, 222f. Each stack 222 corresponds to a different split gate flash memory cell 104. Filling the void between the stack 222 and the word line 110, as well as the void between the stack 222 and the erase gate 112, the semiconductor structure includes a peripheral dielectric sidewall region 224a, 224b and a central dielectric sidewall region 226a, 226b, respectively, running vertically along opposing sidewalls of the stack 222.

The peripheral dielectric sidewall region 224 is disposed between the stack 222 and the word line 110 to electrically isolate the stack 222 from the word line 110. The peripheral dielectric sidewall region 224 includes a first peripheral dielectric extension 228a, 228b and a second peripheral dielectric extension 230a, 230b. The first peripheral dielectric extension 228 extends vertically up to the peripheral floating gate ledge 214 from the base dielectric region 206, and the second peripheral dielectric extension 230 extends vertically up from the peripheral floating gate ledge 214. The first peripheral dielectric extension 228 electrically isolates the floating gate 204 from the word line 110 and, in some embodiments, is formed of silicon dioxide. The second peripheral dielectric extension 230 electrically isolates the control gate 108 from the word line 110 and, in some embodiments, is formed of an ONO dielectric.

The central dielectric sidewall region 226 is disposed between the stack 222 and the erase gate 112 to electrically isolate the stack 222 from the erase gate 112. The central dielectric sidewall region 226 includes a first central dielectric extension 232a, 232b and a second central dielectric extension 234a, 234b. The first central dielectric extension 232 extends vertically up to the central floating gate ledge 216 from the base dielectric region 206, and the second central dielectric extension 234 extends vertically up from the central floating gate ledge 216. The first central dielectric extension 232 electrically isolates the floating gate 204 from the erase gate 112 and, in some embodiments, is formed of silicon dioxide. The second central dielectric extension 234 electrically isolates the control gate 108 from the erase gate 112 and, in some embodiments, is formed of an ONO dielectric.

In operation, the floating gates 204 of the split gate flash memory cells 104 store different amounts charge (e.g., electrons). The charge is advantageously stored in a non-volatile manner so that the stored charge persists in the absence of power. For example, an electronic device including the split gate flash memory cells 104 does not require power for data stored in the split gate flash memory cells 104 to persist. The amount of charge stored represents the difference between a binary "1" and a binary "0" and is varied through program (i.e., write), read, and erase operations. These operations are performed through selective biasing of the erase and control gates 108, 112, as well as through selective biasing of the word lines 110.

During a program operation on one of the split gate flash memory cells 104, a voltage is applied across the shared and individual source/drain regions 114, 212 of the split gate flash memory cell 104. This voltage is typically applied so as to promote the migration of charge from the individual source/drain region 212 to the shared source/drain region 114 when the channel region 116 is in a conductive state. Further, a voltage is applied to the erase gate 112. Typically, the voltage is the same voltage applied to the shared source/drain region 114 so as to prevent the migration of charge between the erase gate 112 and the shared source/drain region 212. Even more, a voltage is applied to the word line 110 to induce part of the channel region 116 to conduct. Application of a voltage to the word line 110 attracts carriers to part of the channel region 116 adjacent to the word line 110. The voltage applied to the word line 110 is typically less than the voltage applied to the shared source/drain region 114.

To complete the program operation, a voltage is applied to the control gate 108. Typically, this voltage is high relative to the voltage applied to the word line 110 and the erase gate 112, as well as the voltage applied across the shared and individual source/drain regions 114, 212. Application the voltage to the control gate 108 induces the remaining part of the channel region 116 to conduct through attraction of carriers. This, in turn, allows electric current to flow between the shared and individual source/drain regions 114, 212 (e.g., electrons flow from the individual source/drain region 212 to the shared source/drain region 114). Further, application of the voltage to the control gate 108 further promotes some of the carriers (e.g., electrons) from the channel region 116 to tunnel through the base dielectric region 206 to the floating gate 204. The carriers are consequently stored within the floating gate 204 in a non-volatile manner.

The charge resulting from the stored carriers screen an electric field formed between the control gate 108 and the channel region 116 when the control gate 108 is biased. This has an effect of increasing the threshold voltage $V_{th}$ of the split gate flash memory cell 104 by an amount $\Delta V_{th}$ that is proportional to the thickness of the base dielectric region 206 between the floating gate 204 and the channel region 116. The threshold voltage increase $\Delta V_{th}$ provides the basis of a read operation on the split gate flash memory cell 104. By applying a voltage $V_{CG}$ to the control gate 108 that is greater than $V_{th}$, but less than $V_{th}+\Delta V_{th}$, the stored state within the split gate flash memory cell 104 can be sensed. If the split gate flash memory cell 104 turns on (i.e., allows charge to flow) during application of the voltage $V_{CG}$, then it stores a first data state (e.g., a logical "0"). If the split gate flash memory cell 104 does not turn on, then it stores a second data state (e.g., a logical "1").

During a read operation on one of the split gate flash memory cells 104, a voltage is applied across the shared and individual source/drain regions 114, 212 of the split gate flash memory cell 104. Typically, this voltage is applied so as to promote the migration of charge from the shared source/drain region 114 to the individual source/drain region 212 when the channel region 116 is in a conductive state. Further, a voltage is applied to the erase gate 112. Typically, the voltage is the same voltage applied to the shared source/drain region 114 so as to prevent the migration of charge between the erase gate 112 and the shared source/drain region 114. Even more, a voltage is applied to the word line 110 to induce part of the channel region 116 to conduct. Application of a voltage to the word line 110 attracts carriers to part of the channel region 116 adjacent to the word line 110. The voltage applied to the word line 110 is typically less than the voltage applied to the shared source/drain region 114. To complete the read operation, the voltage $V_{CG}$ is applied to the control gate 108. This voltage is such that it falls between the threshold voltage and the threshold voltage increase $\Delta V_{th}$ (i.e., $V_{th} < V_{CG} < V_{th} + \Delta V_{th}$).

During an erase operation on one of the split gate flash memory cells 104, a common voltage is applied to the shared and individual source/drain regions 114, 214, as well as the control gate 108 and the word line 110. Even more, a voltage high relative to the common voltage is applied to the erase gate 112. This high voltage promotes charge stored in the floating gate 204 to tunnel (Fowler-Nordheim tunneling) through the first central dielectric extension 232 to the erase gate 112. As a result of this tunneling, the charge is removed from the floating gate 204 and split gate flash memory cell 104 is erased. As discussed above, the protrusions 310 (see FIG. 3) of the floating gates 204 concentrate the electric field generated by the high voltage. By concentrating the electric field, the protrusions 310 advantageously allows faster erase speeds than would otherwise be possible and/or allow a reduction in erase voltage for power saving.

Figure 4:
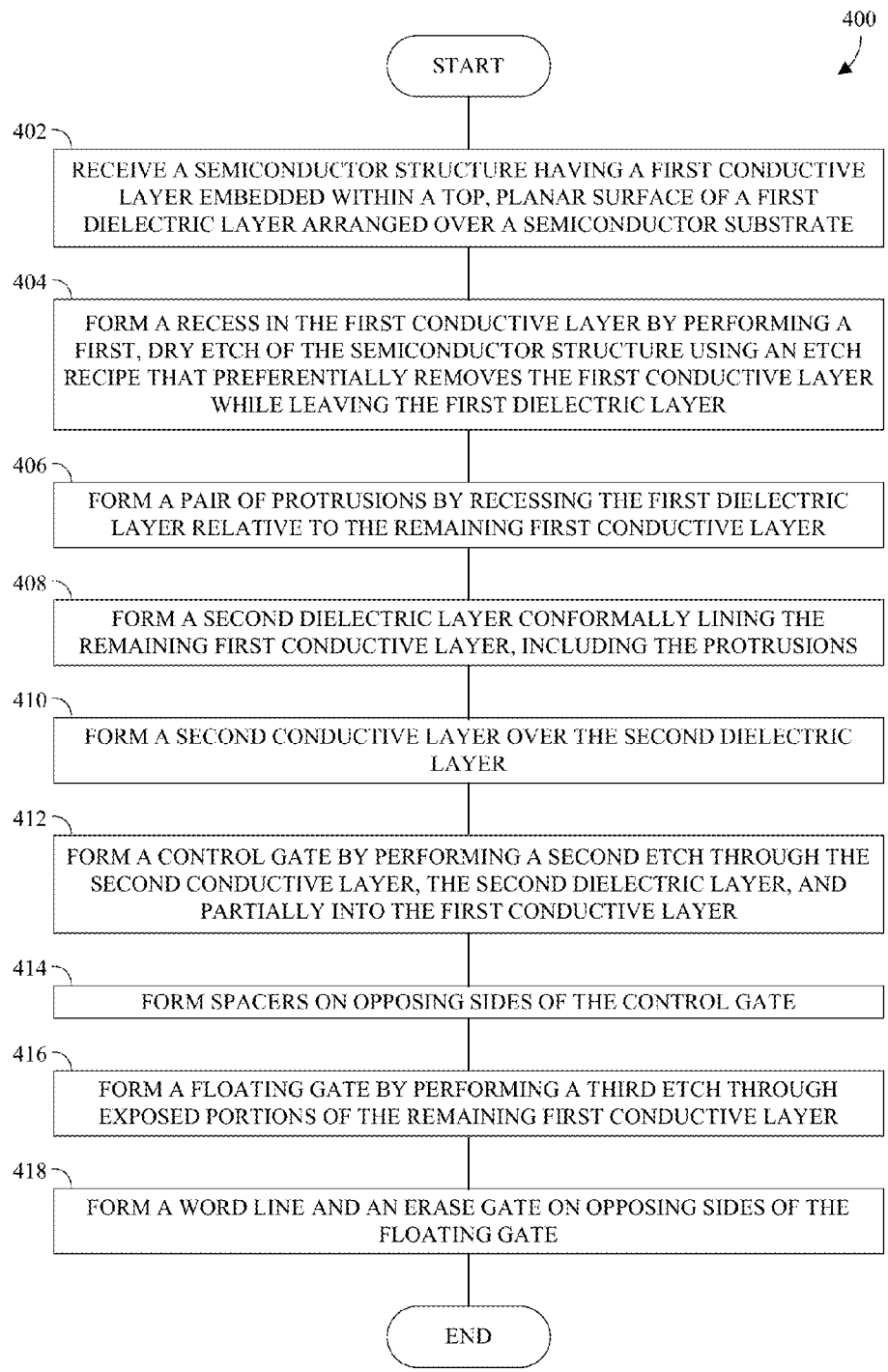
FIG. 4 illustrates a flowchart of some embodiments of a method for manufacturing a semiconductor structure of a split gate flash memory cell, the semiconductor structure employing a floating gate with protrusions.

With reference to FIG. 4, a flow chart 400 of some embodiments of a method for manufacturing the semiconductor structure is provided. According to the method 400, a semiconductor structure is received (Action 402) that has a first conductive layer embedded within a top, planar surface of a first dielectric layer arranged over a semiconductor substrate. A recess is formed (Action 404) in the first conductive layer by performing a first, dry etch of the semiconductor structure using an etch recipe that preferentially removes the first conductive layer while leaving the first dielectric layer (i.e., an etch recipe with an etch rate for the first conductive layer that is greater than an etch rate for the first dielectric layer). In some embodiments, the etch back recipe is comprised primarily of HBr and oxygen, such as $O_2$ gas, optionally with Helium (He) and Argon (Ar) gases diluting the etch back recipe. A flow rate of about 50-500 standard cubic centimeters per minute (sccm) can be used for each of HBr, Ar, and He, and a flow rate of about 5-200 sccm can be used for oxygen (e.g., $O_2$). By controlling the ratio of gases, flow rates, temperature, pressure, ion energy, and so on, the depth and/or steepness of the recess can be controlled. A pair of protrusions are formed (Action 406) by recessing the first dielectric layer relative to the remaining first conductive layer. A second dielectric layer is formed (Action 408) that conformally lines the remaining first conductive layer, including the protrusions, and a second conductive layer is formed (Action 410) over the second dielectric layer. A control gate is formed (Action 412) by performing a second etch through the second conductive layer, the second dielectric layer, and partially into the first conductive layer. Spacers are formed (Action 414) on opposing sides of the control gate, and a floating gate is formed (Action 416) by performing a third etch through exposed portions of the remaining first conductive layer. A word line and an erase gate are formed (Action 418) on opposing sides of the floating gate.

Figure 5A:
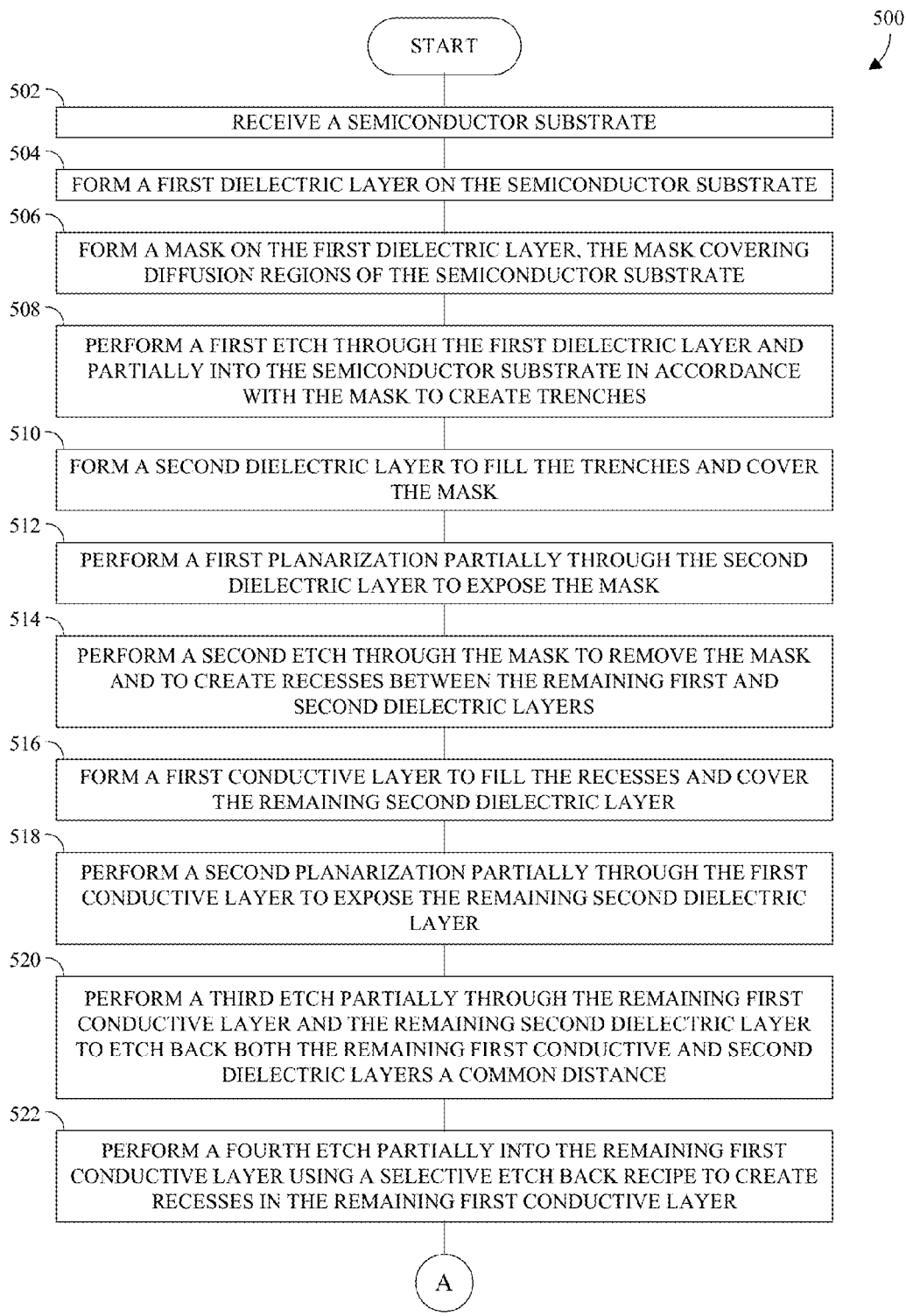
FIGS. 5A & B illustrate a flowchart of some embodiments of a method for manufacturing a semiconductor structure of an array of split gate memory cells, the semiconductor structure employing floating gates with protrusions.
Figure 5B:
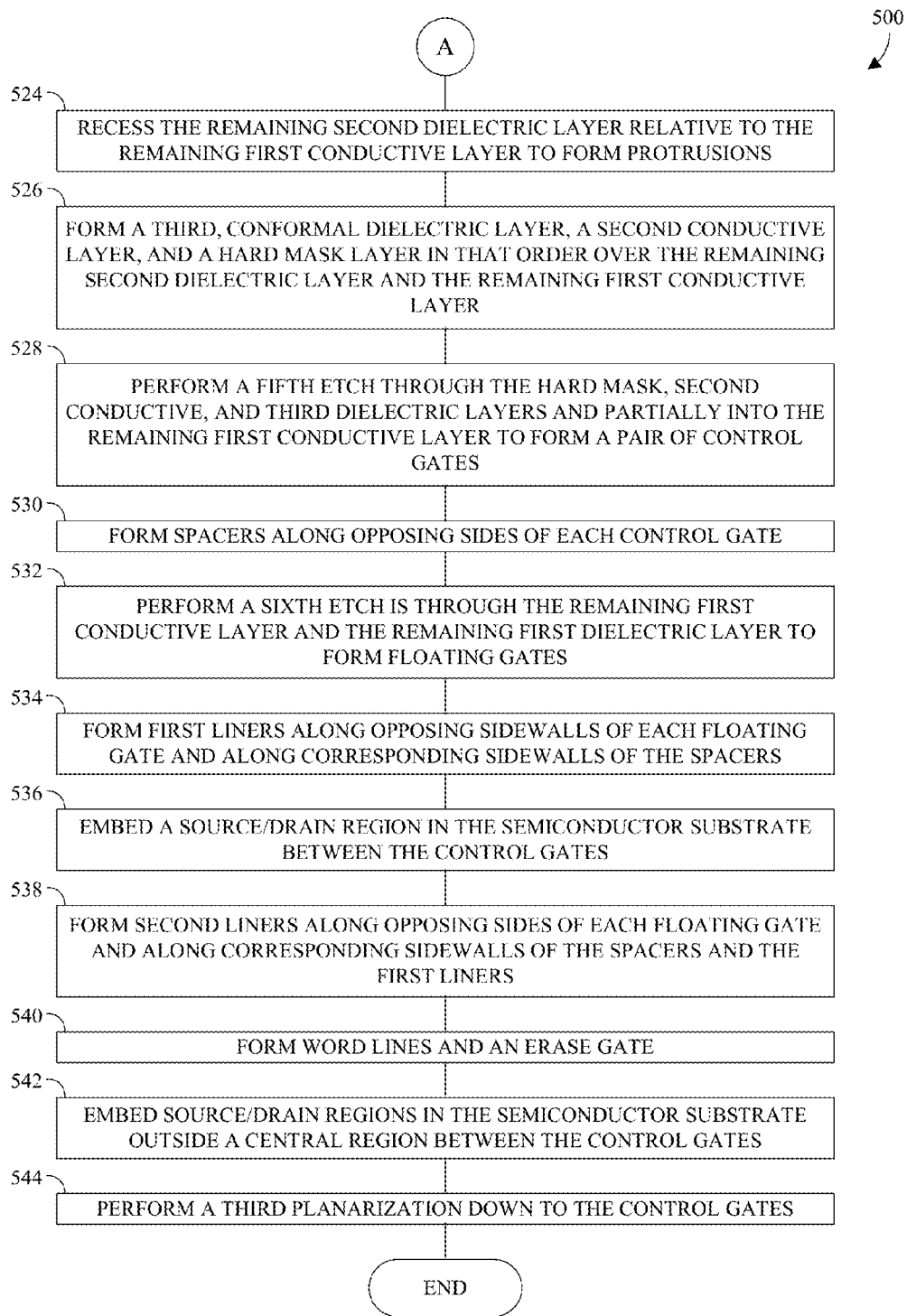

With reference to FIGS. 5A & B, a flow chart 500 of some embodiments of an expanded method of manufacturing the semiconductor structure is provided. According to the expanded method, a semiconductor substrate is received (Action 502). A first dielectric layer is formed (Action 504) on the semiconductor substrate, and a mask is formed (Action 506) on the first dielectric layer. The mask is formed so it covers diffusion regions of the semiconductor substrate. In other words, the mask leaves exposed only those regions of the semiconductor substrate to be employed as isolation regions. A first etch is performed (Action 508) through the first dielectric layer and partially into the semiconductor substrate in accordance with the mask to create trenches. A second dielectric layer is formed (Action 510) to fill the trenches and cover the mask. A first planarization is performed (Action 512) partially through the second dielectric layer to expose the mask, and a second etch is performed (Action 514) through the mask to remove the mask and to create recesses between the remaining first and second dielectric layers. A first conductive layer is formed (Action 516) to fill the recesses and cover the remaining second dielectric layer, and a second planarization is performed (Action 518) partially through the first conductive layer to expose the remaining second dielectric layer. At this point of the expanded method, protrusions in the first conductive layer are ready to be formed.

A third etch is performed (Action 520) partially through the remaining first conductive layer and the remaining second dielectric layer to etch back both the remaining first conductive and second dielectric layers a common distance. This results in a generally planar surface. A fourth, dry etch is performed (Action 522) partially into the remaining first conductive layer using a highly selective (i.e., selective of the remaining first conductive layer relative to the remaining second dielectric layer) etch back recipe, such as HBr and oxygen (e.g., $O_2$), to create recesses in the remaining first conductive layer. In some embodiments, the etch back recipe is comprised primarily of HBr and oxygen, such as $O_2$ gas. Further, in some embodiments, He and Ar gases are used to dilute the etch back recipe. The remaining second dielectric layer is recessed (Action 524) relative to the first conductive layer to form the protrusions.

With the protrusions formed, a third, conformal dielectric layer, a second conductive layer, and a hard mask layer are formed (Action 526) in that order over the remaining second dielectric layer and the remaining first conductive layer. A fifth etch is performed (Action 528) through the hard mask, second conductive, and third dielectric layers and partially into the remaining first conductive layer to form a pair of control gates. Spacers are formed (Action 530) along opposing sides of each control gate, and a sixth etch is performed (Action 532) through the remaining first conductive layer and the remaining first dielectric layer to form floating gates. First liners are formed (Action 534) along opposing sidewalls of each floating gate and along corresponding sidewalls of the spacers. A source region is embedded (Action 536) in the semiconductor substrate between the control gates, and second liners are formed (Action 538) along opposing sides of each floating gate and along corresponding sidewalls of the spacers and the first liners. Word lines and an erase gate are formed (Action 540), and drain regions are embedded (Action 542) in the semiconductor substrate between the control gates. A third planarization (Action 544) is performed down to the control gates.

While the disclosed methods (e.g., the methods described by the flowcharts 400 and 500) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

With reference to FIGS. 6-25, cross-sectional views of some embodiments of the semiconductor structure at various stages of manufacture are provided to illustrate the expanded method. Figures with a suffix of "A" correspond to line A-A' of FIG. 1, and figures with a suffix of "B" correspond to line B-B' of FIG. 1. Although FIGS. 6-25 are described in relation to the expanded method, it will be appreciated that the structures disclosed in FIGS. 6-25 are not limited to the expanded method, but instead may stand alone as structures independent of the expanded method. Similarly, although the expanded method is described in relation to FIGS. 6-25, it will be appreciated that the expanded method is not limited to the structures disclosed in FIGS. 6-25, but instead may stand alone independent of the structures disclosed in FIGS. 6-25.

Figure 6A:
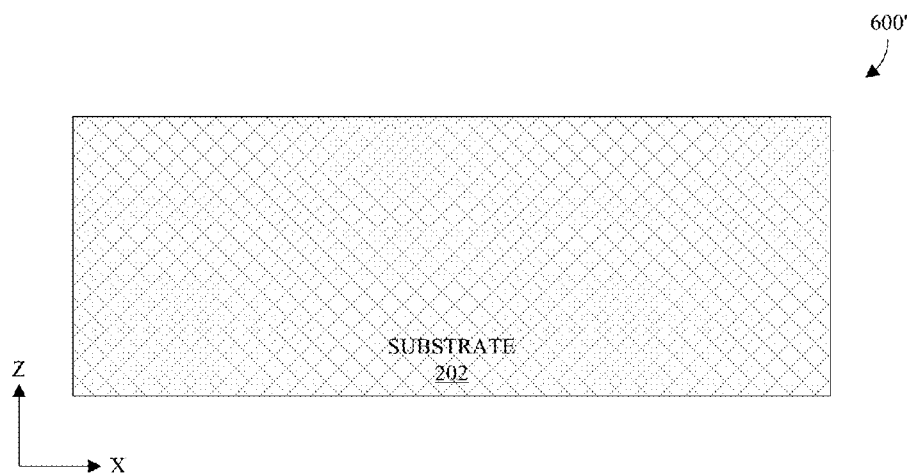
FIGS. 6A & B respectively illustrate cross-sectional views of some embodiments of the semiconductor structure of FIG. 1 at a stage of manufacture, the cross-sectional views respectively along lines A-A' and B-B' of FIG. 1.
Figure 6B:
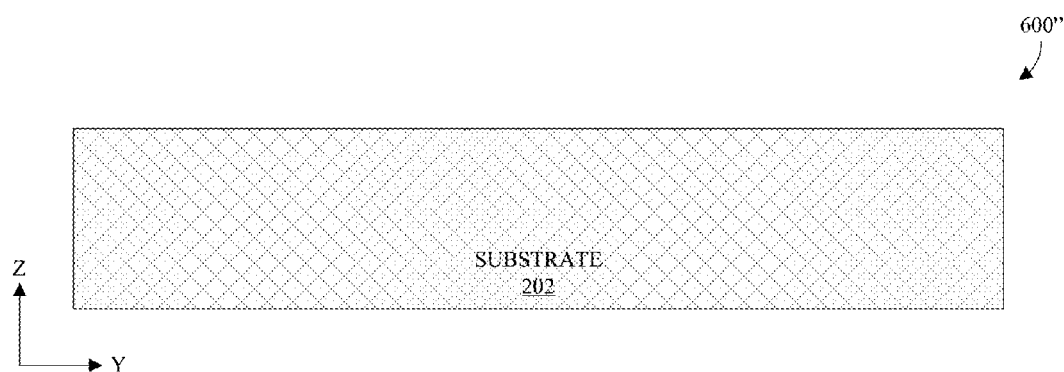

FIGS. 6A & B illustrate cross-sectional views 600', 600", respectively, of some embodiments corresponding to Action 502. As shown by FIGS. 6A & B, a semiconductor substrate 202 is received. The semiconductor substrate 202 is typically planar with a uniform thickness. Further, the semiconductor substrate 202 is n- or p-type, and can, for example, be a bulk wafer, such as a Si wafer, or a silicon-on-insulator (SOI) substrate. If present, an SOI substrate is often made up of an active layer of high quality silicon in which the split gate flash memory cells 104 are formed. In such instances, the split gate flash memory cells 104 are arranged over a buried layer (BOX) of electrically insulating silicon dioxide, which is arranged over a bulk silicon support substrate (not shown).

Figure 7A:
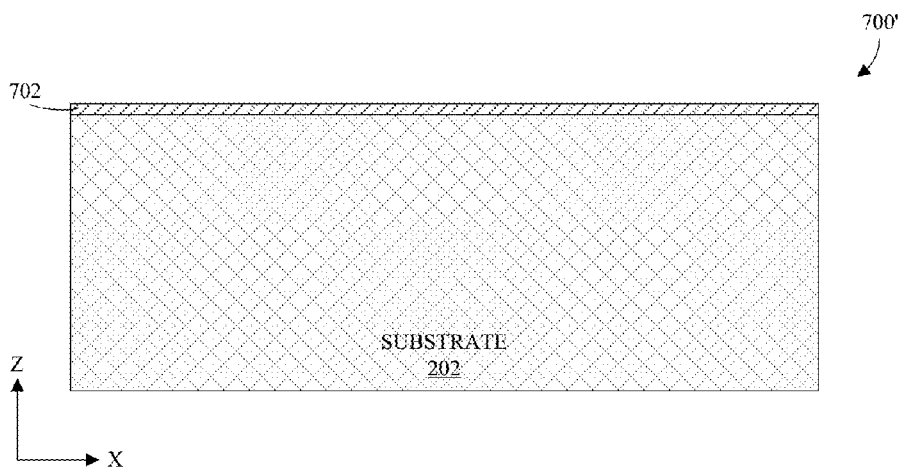
FIGS. 7A & B respectively illustrate cross-sectional views of some embodiments of the semiconductor structure of FIG. 1 at a stage of manufacture, the cross-sectional views respectively along lines A-A' and B-B' of FIG. 1.
Figure 7B:
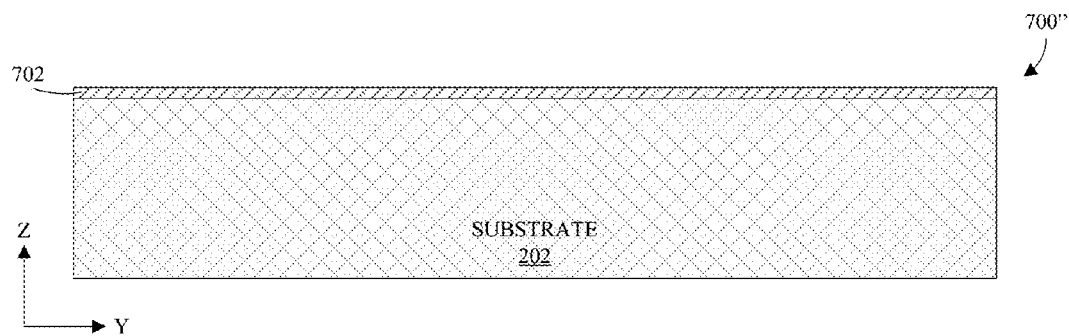

FIGS. 7A & B illustrate cross-sectional views 700', 700", respectively, of some embodiments corresponding to Action 504. As shown by FIGS. 7A & B, a first dielectric layer 702 is formed on a top surface of the semiconductor substrate 202. The first dielectric layer 702 is typically an oxide, such as silicon dioxide.

Figure 8A:
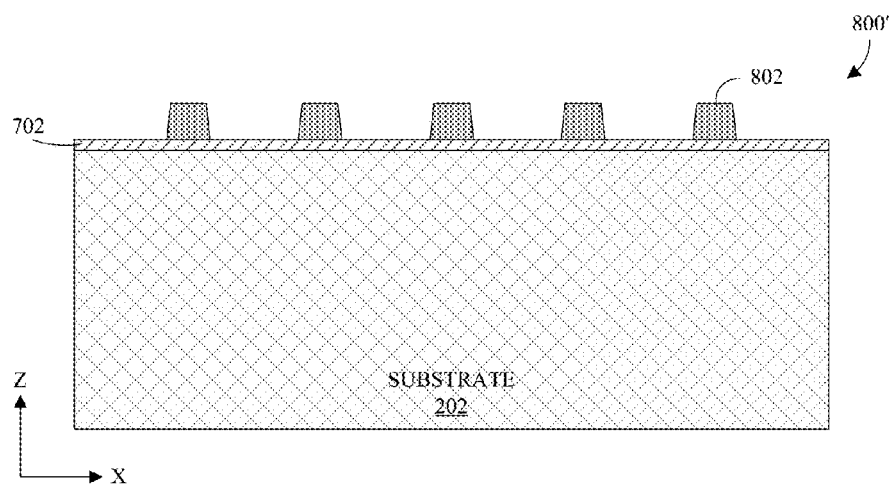
FIGS. 8A & B respectively illustrate cross-sectional views of some embodiments of the semiconductor structure of FIG. 1 at a stage of manufacture, the cross-sectional views respectively along lines A-A' and B-B' of FIG. 1.
Figure 8B:
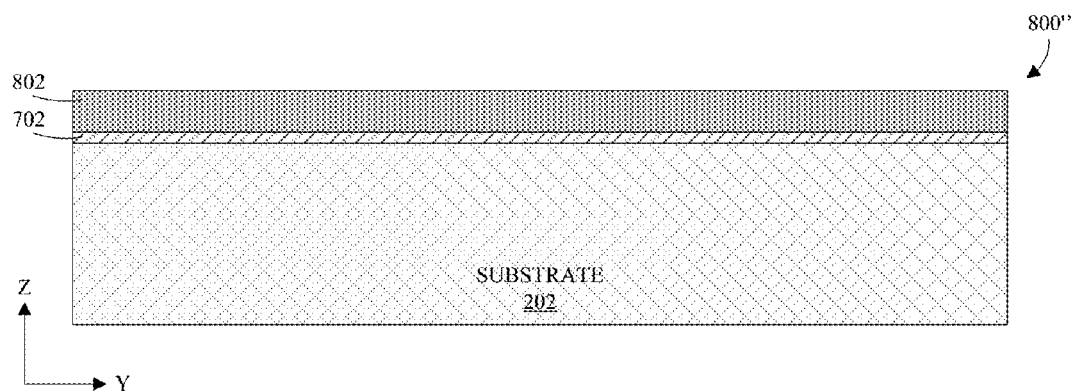

FIGS. 8A & B illustrate cross-sectional views 800', 800", respectively, of some embodiments corresponding to Action 506. As shown by FIGS. 8A & B, a mask 802 is formed on the first dielectric layer 702. The mask 802 is formed so it covers diffusion regions of the semiconductor substrate 202. For example, the mask 802 can be formed to leave exposed only those regions of the semiconductor substrate 202 to be employed as isolation regions. The mask 802 is typically formed of silicon nitride, but other materials are amenable.

Figure 9A:
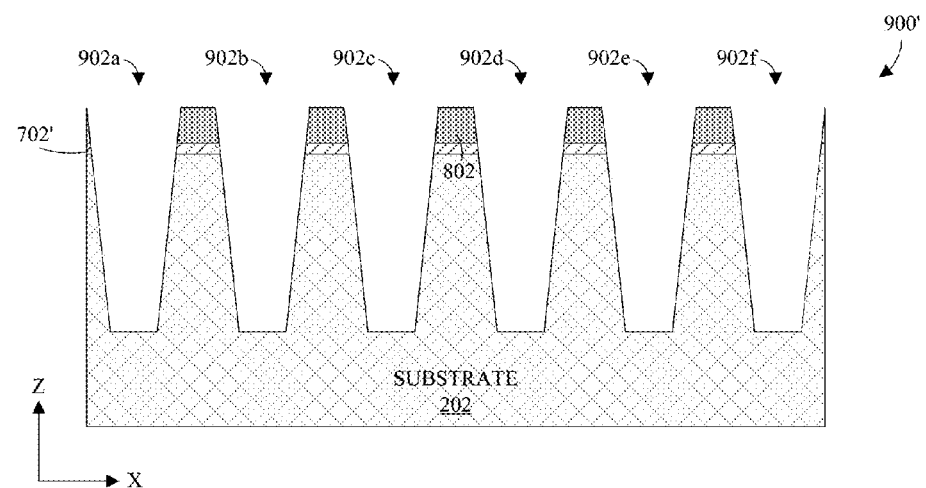
FIGS. 9A & B respectively illustrate cross-sectional views of some embodiments of the semiconductor structure of FIG. 1 at a stage of manufacture, the cross-sectional views respectively along lines A-A' and B-B' of FIG. 1.
Figure 9B:
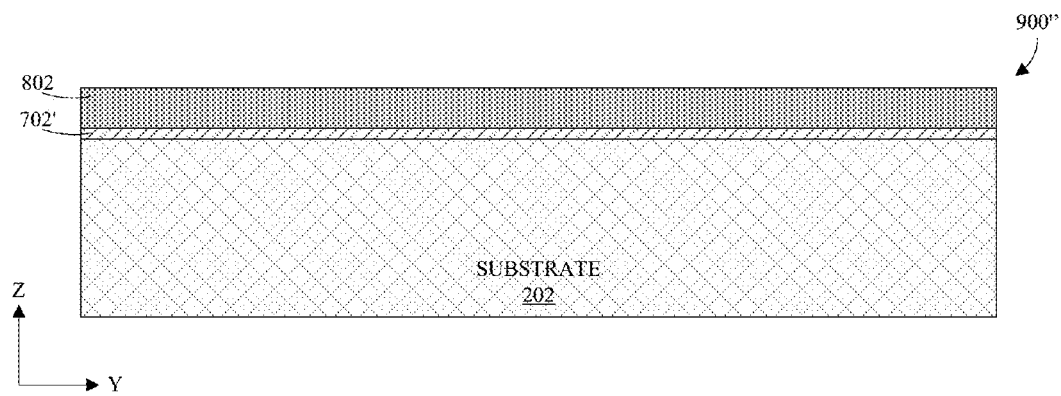

FIGS. 9A & B illustrate cross-sectional views 900', 900", respectively, of some embodiments corresponding to Action 508. As shown by FIGS. 9A & B, a first etch is performed through the first dielectric layer 702 and partially into the semiconductor substrate 202 in accordance with the mask 802 to create trenches 902a-f. The trenches 902 are spaced to define diffusion regions therebetween for the split gate flash memory cells 104.

Figure 10A:
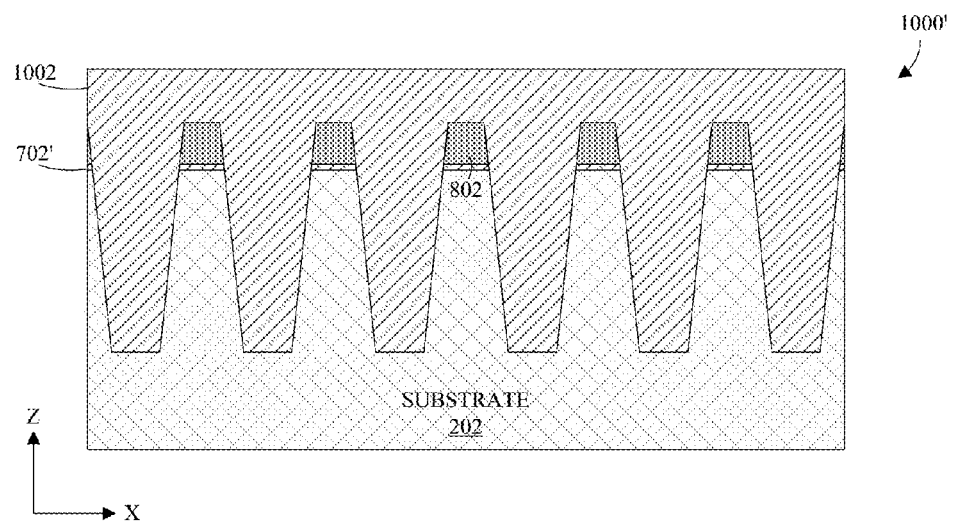
FIGS. 10A & B respectively illustrate cross-sectional views of some embodiments of the semiconductor structure of FIG. 1 at a stage of manufacture, the cross-sectional views respectively along lines A-A' and B-B' of FIG. 1.
Figure 10B:
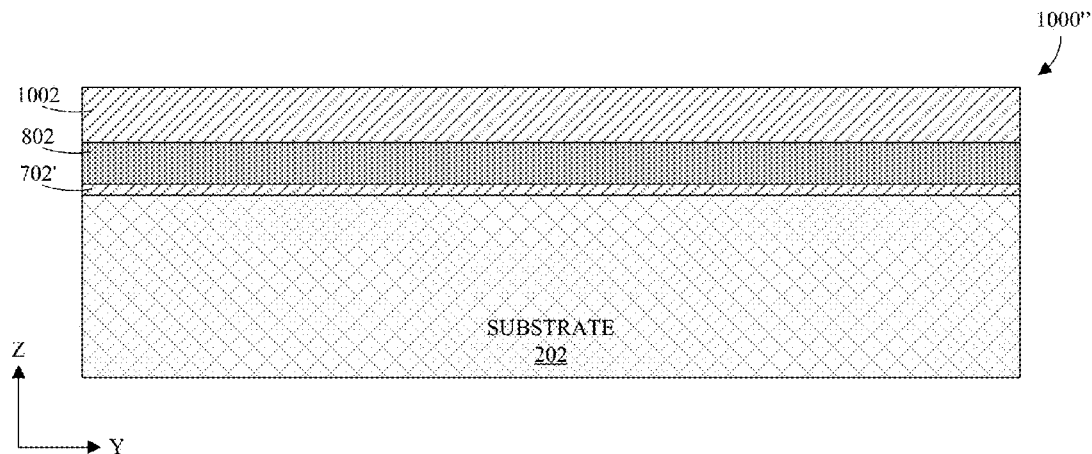

FIGS. 10A & B illustrate cross-sectional views 1000', 1000", respectively, of some embodiments corresponding to Action 510. As shown by FIGS. 10A & B, a second dielectric layer 1002 is formed to fill the trenches 902 and cover the mask 802. The second dielectric layer 1002 is typically formed of an oxide, such as silicon dioxide.

Figure 11A:
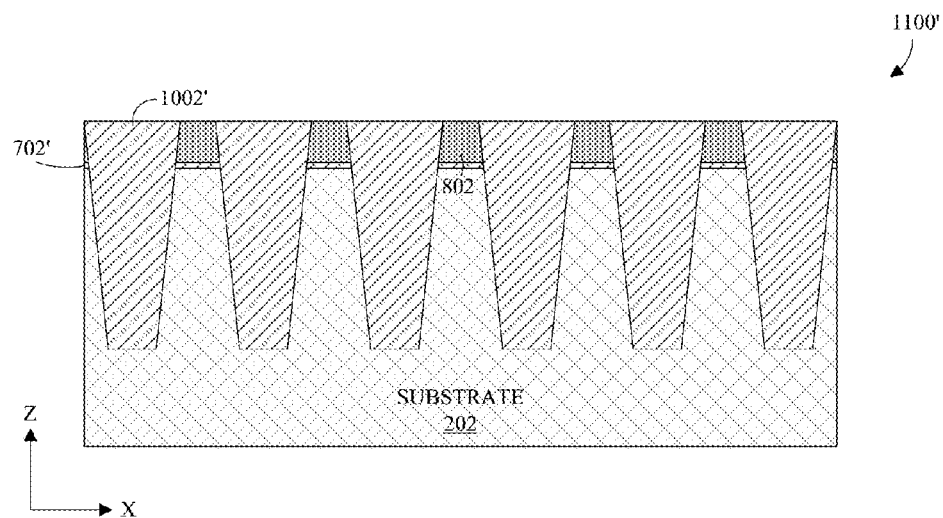
FIGS. 11A & B respectively illustrate cross-sectional views of some embodiments of the semiconductor structure of FIG. 1 at a stage of manufacture, the cross-sectional views respectively along lines A-A' and B-B' of FIG. 1.
Figure 11B:
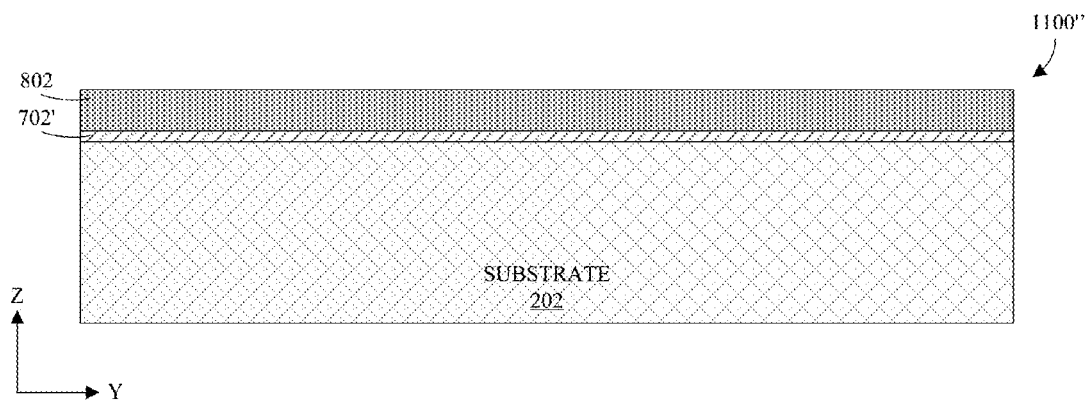

FIGS. 11A & B illustrate cross-sectional views 1100', 1100", respectively, of some embodiments corresponding to Action 512. As shown by FIGS. 11A & B, a first planarization is performed partially through the second dielectric layer 1002 to expose the mask 802.

Figure 12A:
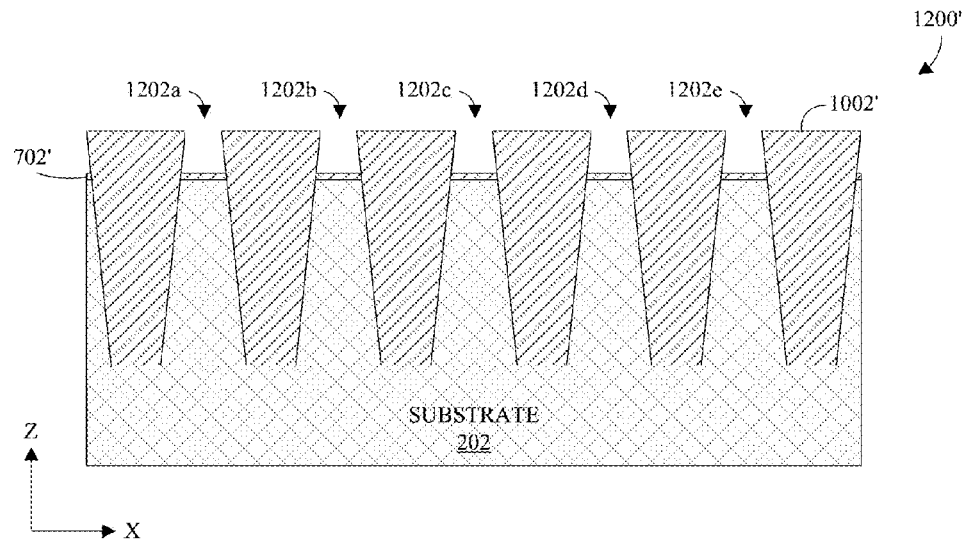
FIGS. 12A & B respectively illustrate cross-sectional views of some embodiments of the semiconductor structure of FIG. 1 at a stage of manufacture, the cross-sectional views respectively along lines A-A' and B-B' of FIG. 1.
Figure 12B:
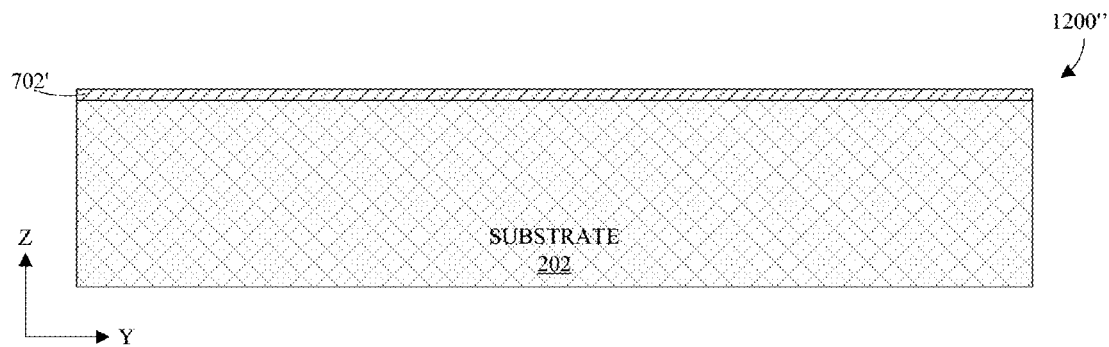

FIGS. 12A & B illustrate cross-sectional views 1200', 1200", respectively, of some embodiments corresponding to Action 514. As shown by FIGS. 12A & B, a second etch is performed through the mask 802 to remove the mask 802 and to create recesses 1202a-e between the remaining first and second dielectric layers 702', 1002'.

Figure 13A:
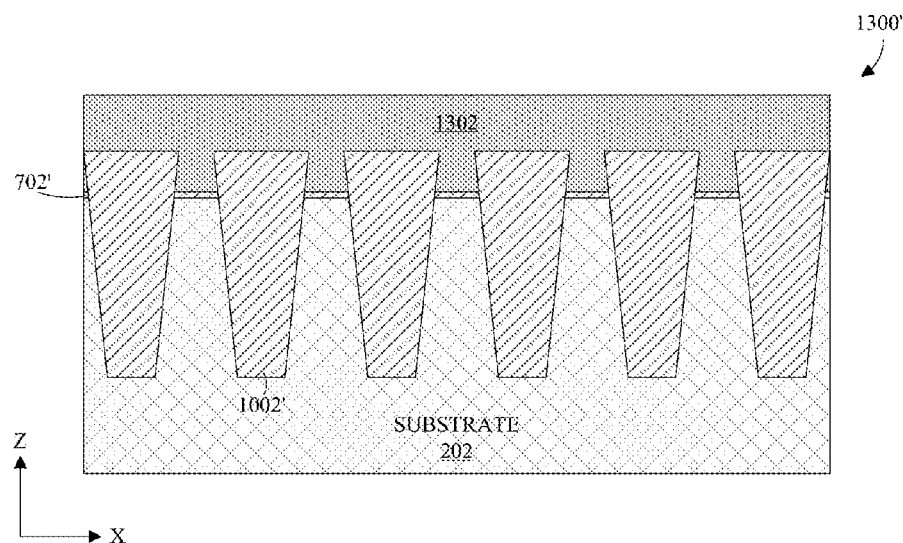
FIGS. 13A & B respectively illustrate cross-sectional views of some embodiments of the semiconductor structure of FIG. 1 at a stage of manufacture, the cross-sectional views respectively along lines A-A' and B-B' of FIG. 1.
Figure 13B:
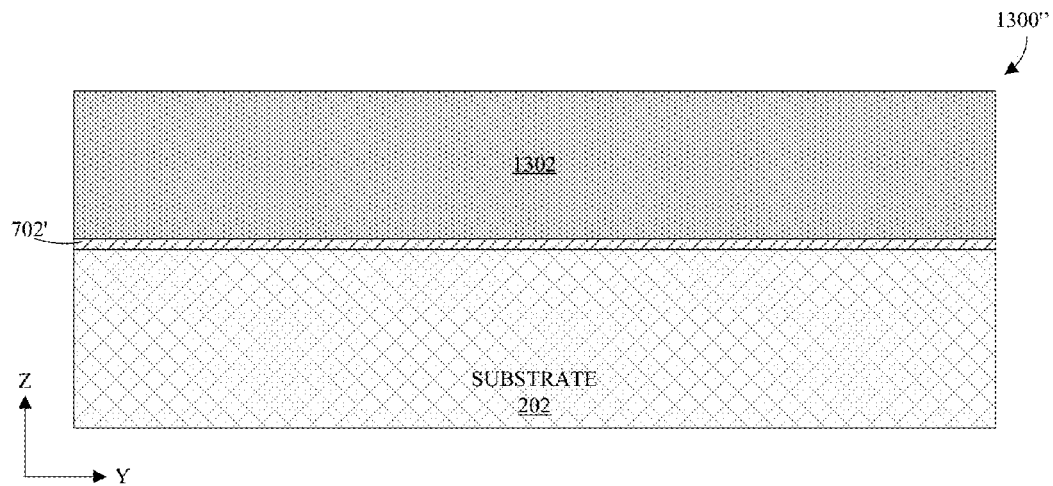

FIGS. 13A & B illustrate cross-sectional views 1300', 1300", respectively, of some embodiments corresponding to Action 516. As shown by FIGS. 13A & B, a first conductive layer 1302 is formed to fill the recesses 1202 and cover the remaining second dielectric layer 1002'. The first conductive layer 1302 is typically formed of polysilicon and typically has a maximum thickness of about 1800 A.

Figure 14A:
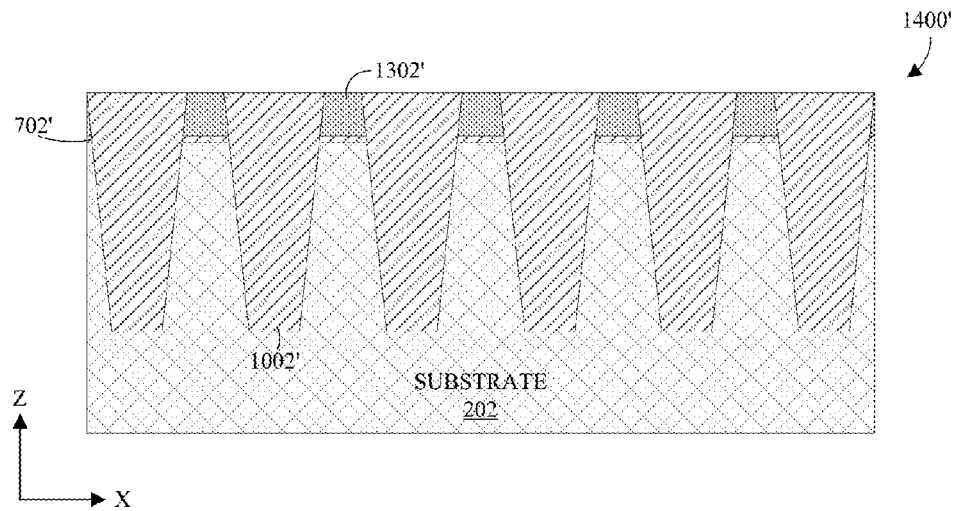
FIGS. 14A & B respectively illustrate cross-sectional views of some embodiments of the semiconductor structure of FIG. 1 at a stage of manufacture, the cross-sectional views respectively along lines A-A' and B-B' of FIG. 1.
Figure 14B:
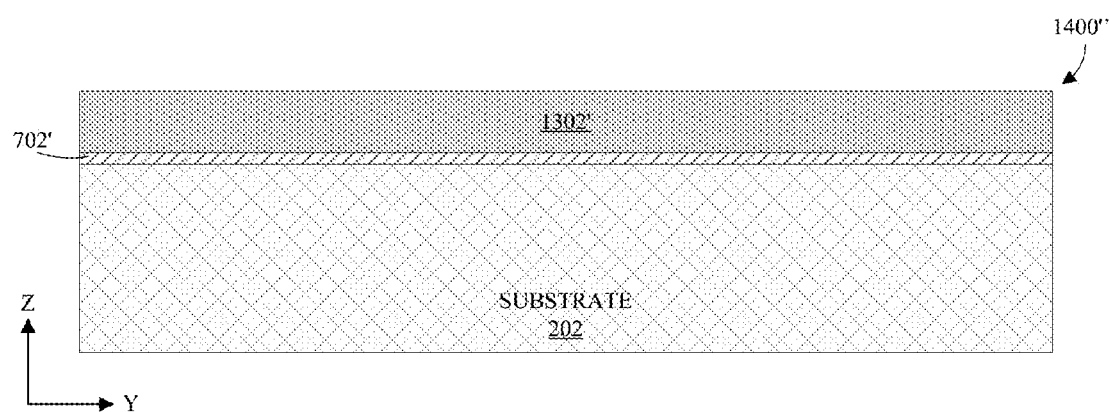

FIGS. 14 A & B illustrate cross-sectional views 1400', 1400", respectively, of some embodiments corresponding to Action 518. As shown by FIGS. 14A & B, a second planarization is performed partially through the second conductive layer 1302 to expose the remaining second dielectric layer 1002'. Typically, the maximum thickness of the remaining second conductive layer 1302' is about 700 A.

Figure 15A:
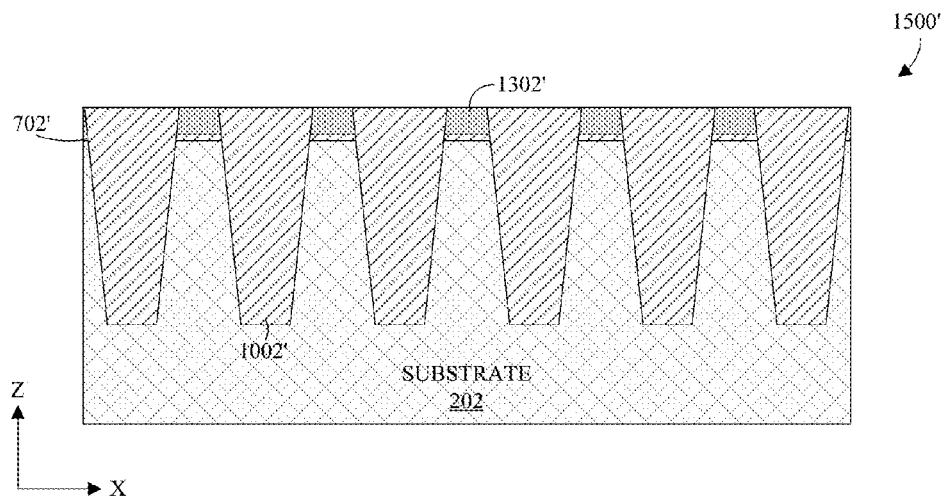
FIGS. 15A & B respectively illustrate cross-sectional views of some embodiments of the semiconductor structure of FIG. 1 at a stage of manufacture, the cross-sectional views respectively along lines A-A' and B-B' of FIG. 1.
Figure 15B:
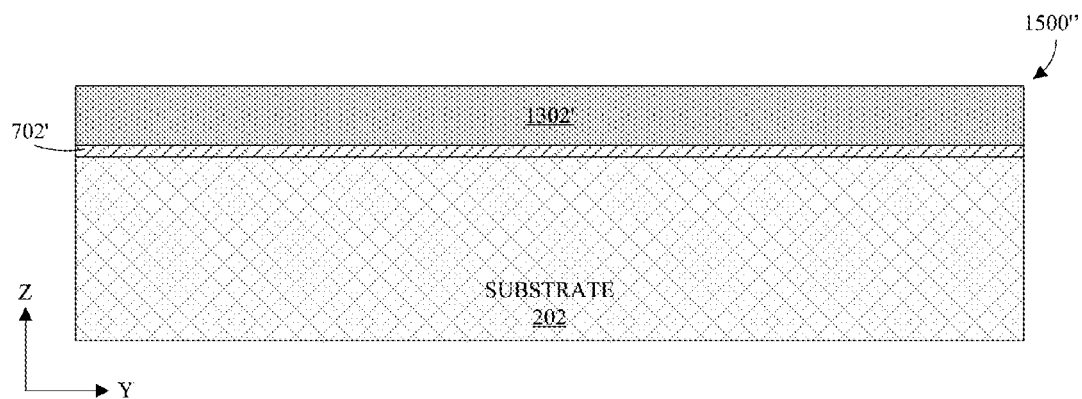

FIGS. 15 A & B illustrate cross-sectional views 1500', 1500", respectively, of some embodiments corresponding to Action 520. As shown by FIGS. 15A & B, a third etch is performed partially through the remaining first conductive layer 1302' and partially through the remaining second dielectric layer 1002' to etch back both the remaining first conductive and second dielectric layers 1002', 1302' a common distance. This action is typically employed to set the maximum thickness of the floating gates 204 (discussed hereafter). The third etch typically leaves a generally planar surface and is typically performed using a dry etch with a low selectivity etch recipe. The etch recipe can, for example, be primarily comprised of $CF_4$ and $CH_2F_2$ gas. Further, the third etch typically results in the remaining first conductive layer 1302' having a thickness of about 350 A.

Figure 16A:
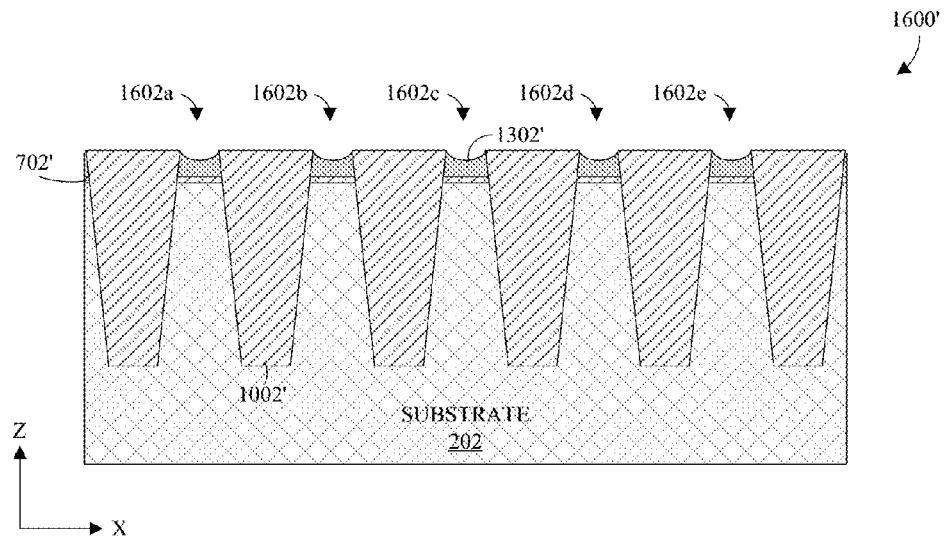
FIGS. 16A & B respectively illustrate cross-sectional views of some embodiments of the semiconductor structure of FIG. 1 at a stage of manufacture, the cross-sectional views respectively along lines A-A' and B-B' of FIG. 1.
Figure 16B:
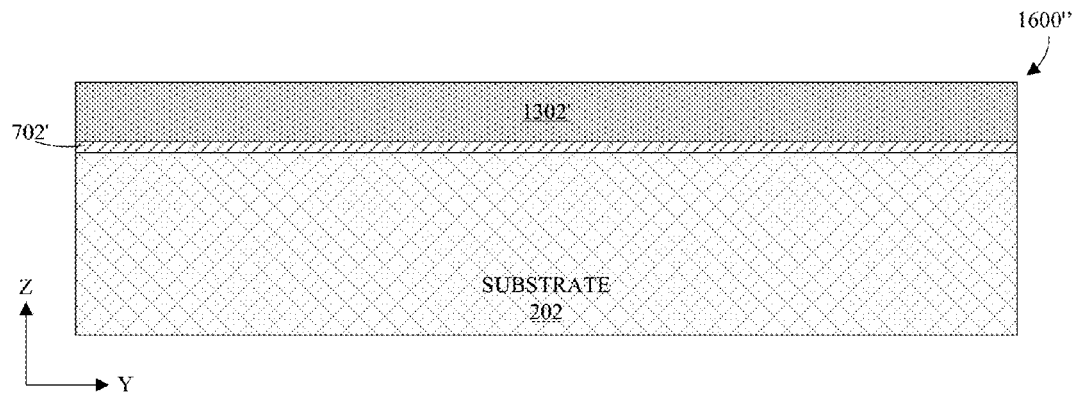

FIGS. 16 A & B illustrate cross-sectional views 1600', 1600", respectively, of some embodiments corresponding to Action 522. As shown by FIGS. 16A & B, a fourth, dry etch is performed partially into the remaining first conductive layer 1302' using a highly selective etch back recipe to create recesses 1602a-e in a top surface of the remaining first conductive layer 1302'. The etch recipe is highly (or more) selective of the remaining first conductive layer 1302' relative to the remaining second dielectric layer 1002'. Hence, the etch recipe preferentially etches the remaining first conductive layer 1302' while leaving the remaining second dielectric layer 1002' more or less untouched. The recesses 1602 typically arc, as illustrated, into the remaining first conductive layer 1302' from one side of the remaining first conductive layer 1302' to the other side of the remaining first conductive layer 1302'. Further, the recesses 1602 typically have a depth of about 20-180 A. By controlling the ratio of gases, flow rates, temperature, pressure, ion energy, and so on, the depth and/or steepness of the recesses can be controlled. Where the remaining first conductive layer 1302' is formed of polysilicon and the remaining second dielectric layer 1002' is an oxide, the highly selective etch recipe is comprised of primarily HBr and oxygen, such as $O_2$ gas. Further, in some embodiments, He and Ar gases are used to dilute the etch back recipe. A flow rate of about 50-500 sscm can be used for each of HBr, Ar, and He, and a flow rate of about 5-200 sccm can be used for oxygen (e.g., $O_2$).

Figure 17A:
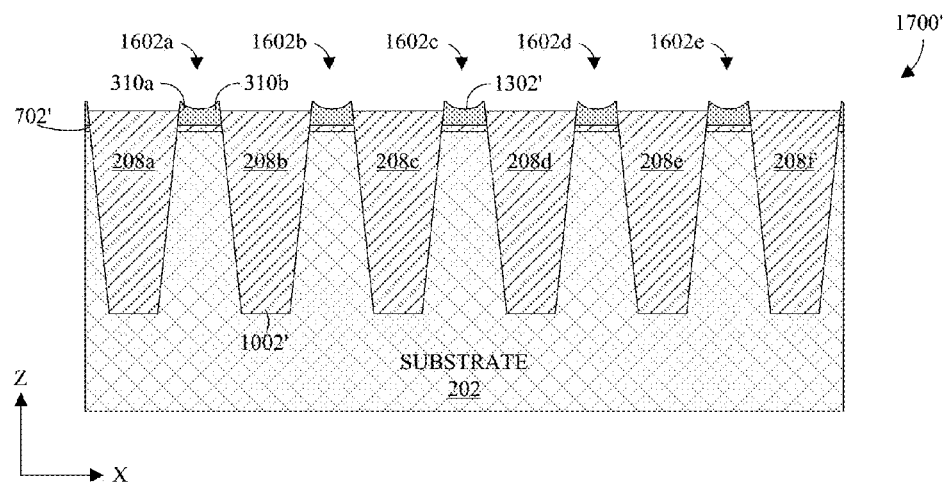
FIGS. 17A & B respectively illustrate cross-sectional views of some embodiments of the semiconductor structure of FIG. 1 at a stage of manufacture, the cross-sectional views respectively along lines A-A' and B-B' of FIG. 1.
Figure 17B:
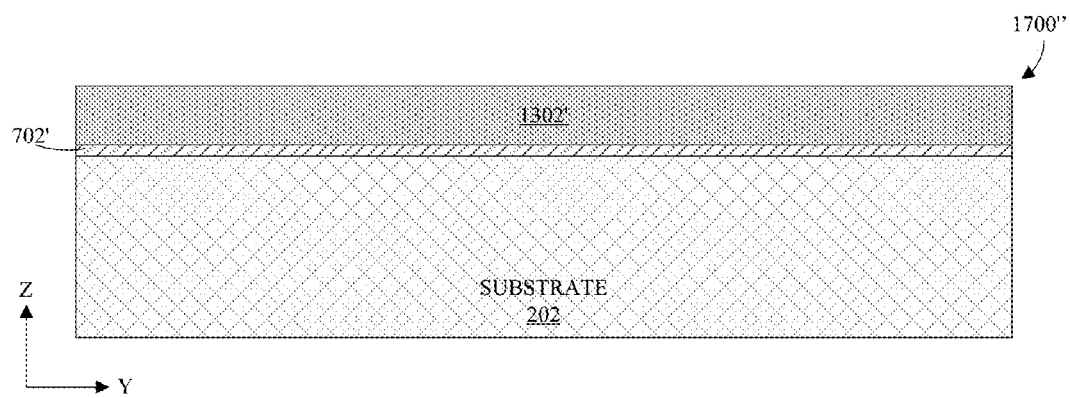

FIGS. 17 A & B illustrate cross-sectional views 1700', 1700", respectively, of some embodiments corresponding to Action 524. As shown by FIGS. 17A & B, the remaining second dielectric layer 1002' is recessed relative to the remaining first conductive layer 1302' to form protrusions 310a, 310b from the first conductive layer 1302' and isolation regions 208a-f. For readability, only some of the protrusions 310 are specifically labeled. The approach by which the remaining second dielectric layer 1002' is recessed depends on the recess amount, which typically ranges from about 200-500 A. In some embodiments, the remaining second dielectric layer 1002' is recessed by first performing a dry etch with a high selectivity etch recipe and subsequently performing a wet dip process with, for example, hydrogen fluoride (HF). In contrast with the highly selective etch recipe used to form the recesses 1602, this highly selective etch recipe is highly (or more) selective of the remaining second dielectric layer 1002' relative to the remaining first conductive layer 1302'.

Figure 18A:
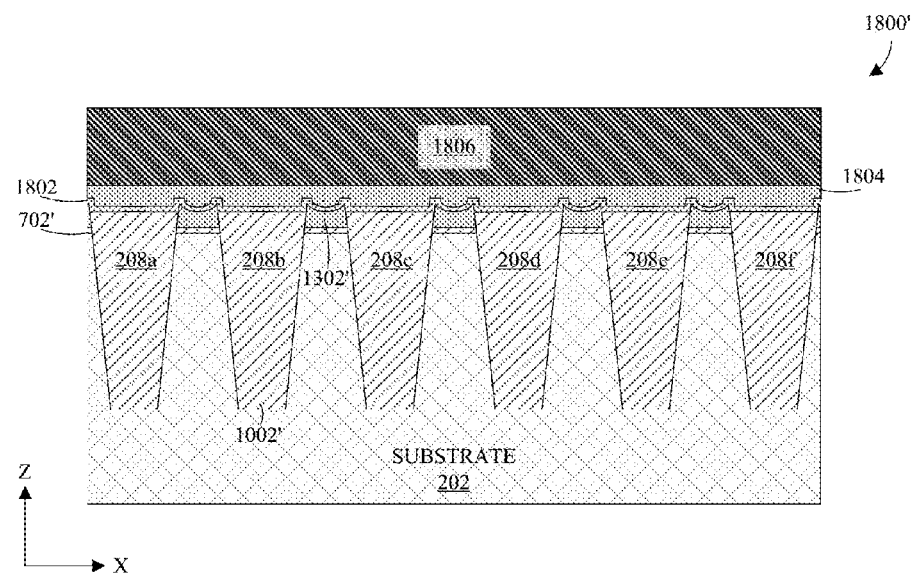
FIGS. 18A & B respectively illustrate cross-sectional views of some embodiments of the semiconductor structure of FIG. 1 at a stage of manufacture, the cross-sectional views respectively along lines A-A' and B-B' of FIG. 1.
Figure 18B:
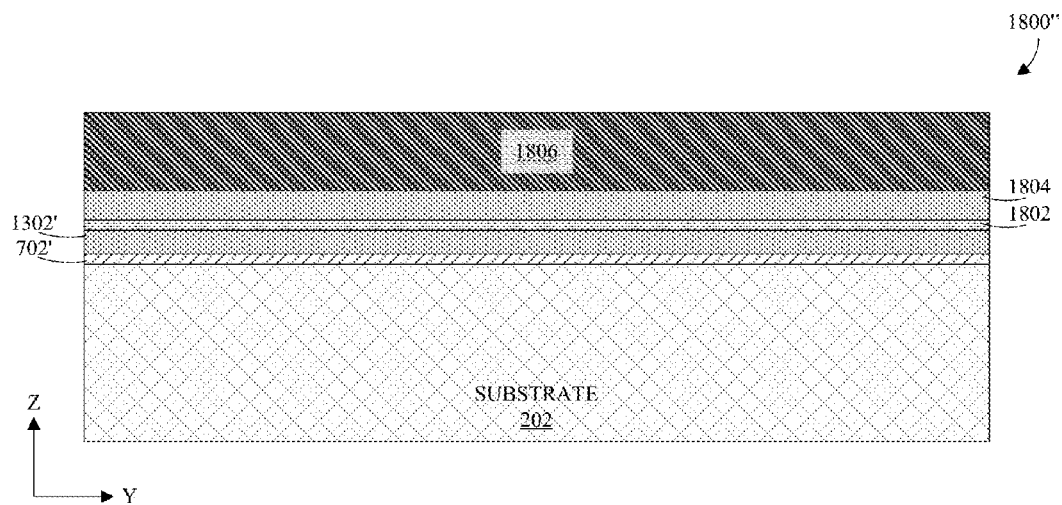

FIGS. 18 A & B illustrate cross-sectional views 1800', 1800", respectively, of some embodiments corresponding to Action 526. As shown by FIGS. 18A & B, a third, conformal dielectric layer 1802, a second conductive layer 1804, and a hard mask layer 1806 are stacked or formed in that order over the isolation regions 208 (or the remaining second dielectric layer 1002') and the remaining first conductive layer 1302'. The third dielectric layer 1802 is typically an ONO dielectric and conforms to the remaining first conductive and the second dielectric layers 1002', 1302'. The second conductive layer is typically polysilicon and typically has a planar top surface. The hard mask layer is typically a nitride-oxide-nitride (NON) dielectric and typically has a planar top surface.

Figure 19A:
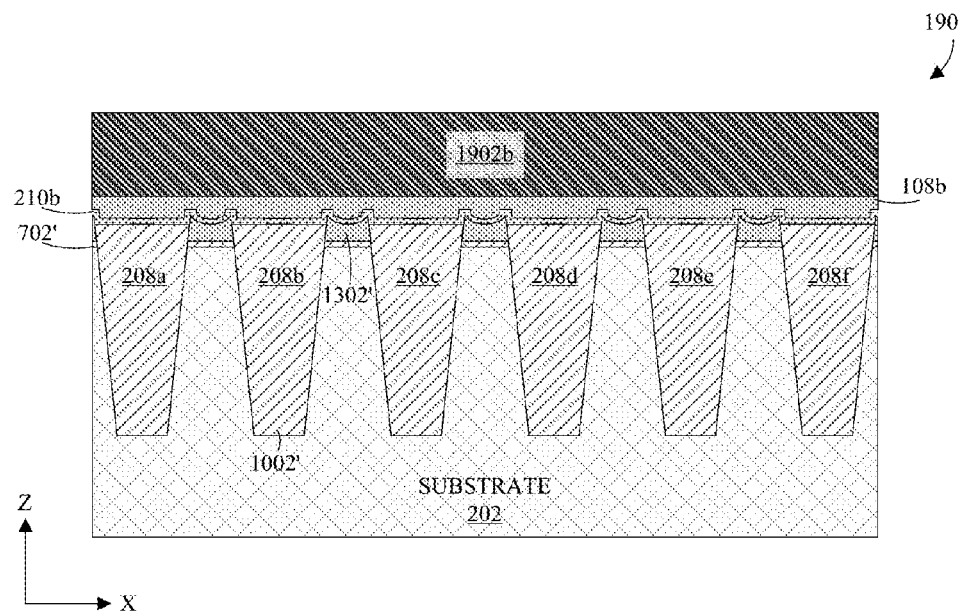
FIGS. 19A & B respectively illustrate cross-sectional views of some embodiments of the semiconductor structure of FIG. 1 at a stage of manufacture, the cross-sectional views respectively along lines A-A' and B-B' of FIG. 1.
Figure 19B:
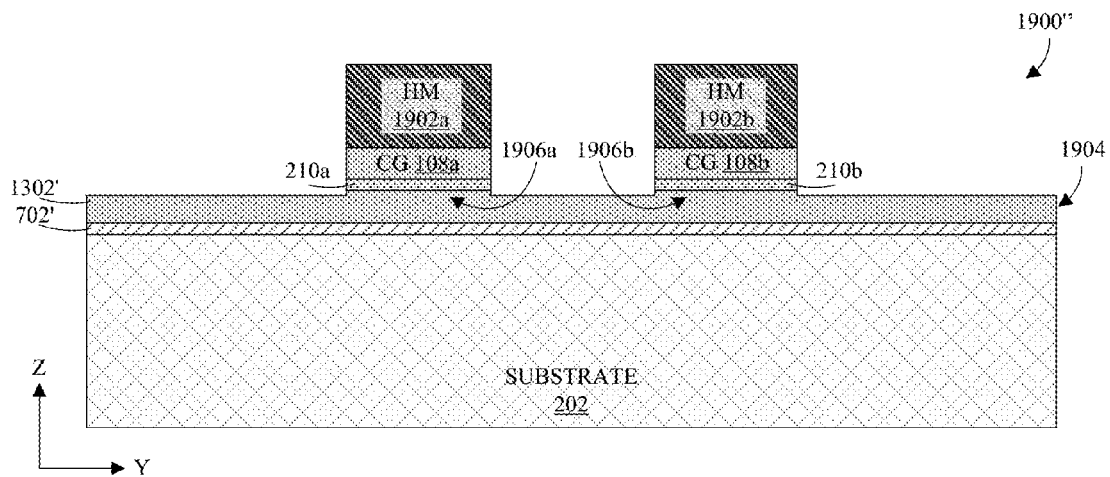

FIGS. 19 A & B illustrate cross-sectional views 1900', 1900", respectively, of some embodiments corresponding to Action 528. As shown by FIGS. 19A & B, a fifth etch is performed through the hard mask, second conductive, and third dielectric layers 1802, 1804, 1806 and partially into the remaining first conductive layer 1302' to form a pair of spaced control gates 108a, 108b. The formed control gates 108 are each sandwiched between an inter-gate dielectric region 210a, 210b and a hard mask 1902a, 1902b, and each rest atop the remaining first conductive layer 1302'. The inter-gate dielectric region 210 electrically isolates the remaining first conductive layer 1302' from the control gates 108, while the hard mask 1902 masks the control gates 108 during manufacture. The remaining first conductive layer 1302' includes a base region 1904 of uniform thickness and an elevated region 1906a, 1906b atop the base region 1904 for each control gate 108. The elevated region 1906 for a control gate 108 supports the control gate 108 and/or otherwise acts as a pedestal for the control gate 108.

Figure 20A:
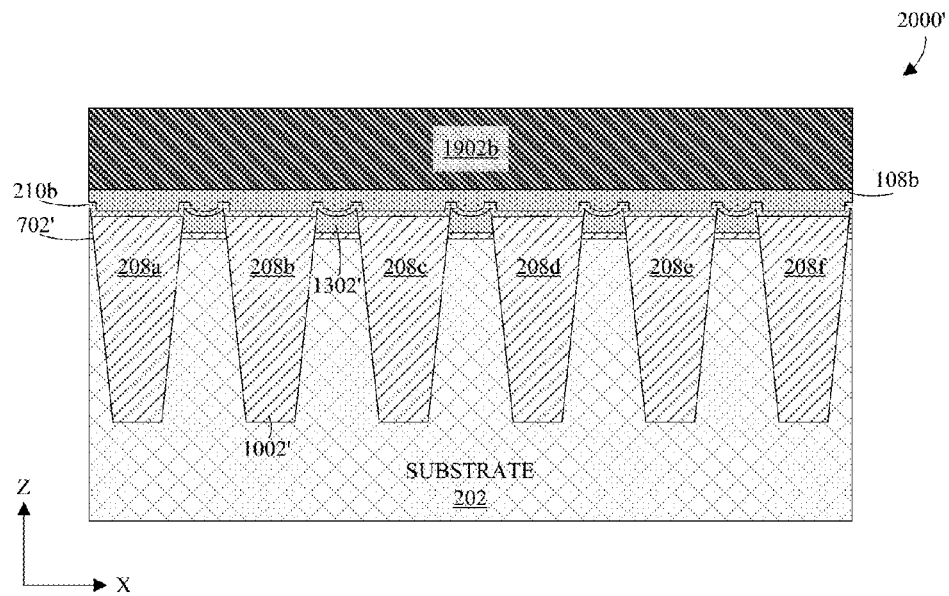
FIGS. 20A & B respectively illustrate cross-sectional views of some embodiments of the semiconductor structure of FIG. 1 at a stage of manufacture, the cross-sectional views respectively along lines A-A' and B-B' of FIG. 1.
Figure 20B:
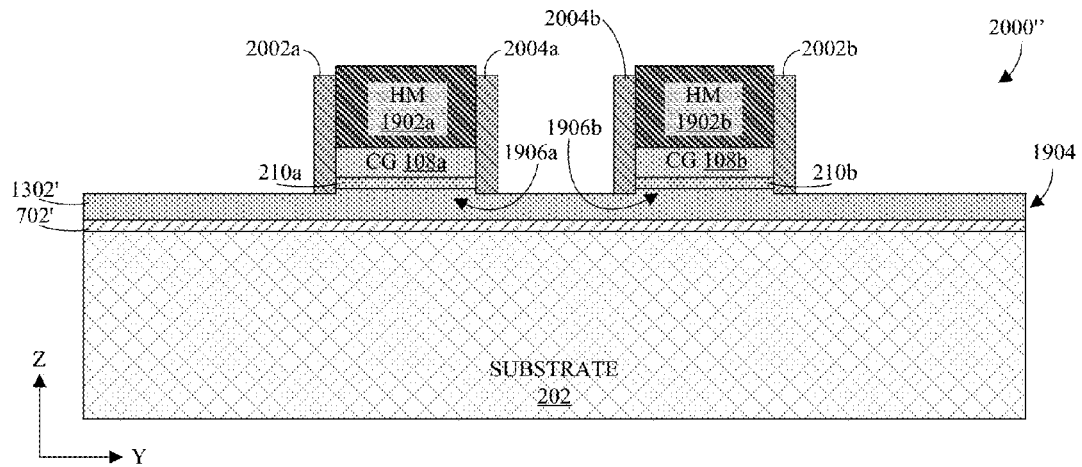

FIGS. 20 A & B illustrate cross-sectional views 2000', 2000", respectively, of some embodiments corresponding to Action 530. As shown by FIGS. 20A & B, peripheral spacers 2002a, 2002b and central spacers 2004a, 2004b are formed along opposing sidewalls of each control gate 108. The opposing sidewalls of a control gate 108 upon which the spacers 2002, 2004 are formed face a central region between the control gates 108 and a peripheral region on the opposite side of the control gate 108 as the central region, respectively. The spacers 2002, 2004 of a control gate 108 extend from the remaining first conductive layer 1302', along the sidewalls of the control gate 108, to approximately even with a top surface of the hard mask 1902. In some embodiments, the spacers 2002, 2004 are formed by conformally forming an intermediate dielectric layer over sidewalls of the control gates 108 and the inter-gate dielectric regions 210, over the hard masks 1902, and over the remaining first conductive layer 1302'. Typically, the intermediate dielectric is an ONO dielectric, but other types of dielectrics can be used in place of the ONO dielectric. An etch is then performed through the intermediate dielectric layer to remove portions of the intermediate dielectric layer that line or are otherwise formed on a horizontal surface of the remaining first conductive layer 1302' and, in some embodiments, of the hard masks 1902.

Figure 21A:
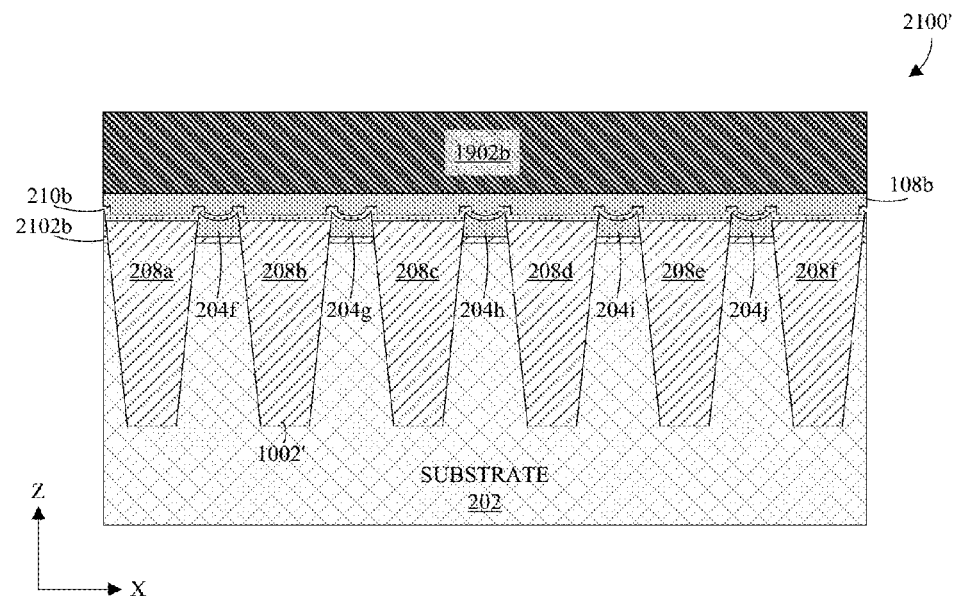
FIGS. 21A & B respectively illustrate cross-sectional views of some embodiments of the semiconductor structure of FIG. 1 at a stage of manufacture, the cross-sectional views respectively along lines A-A' and B-B' of FIG. 1.
Figure 21B:
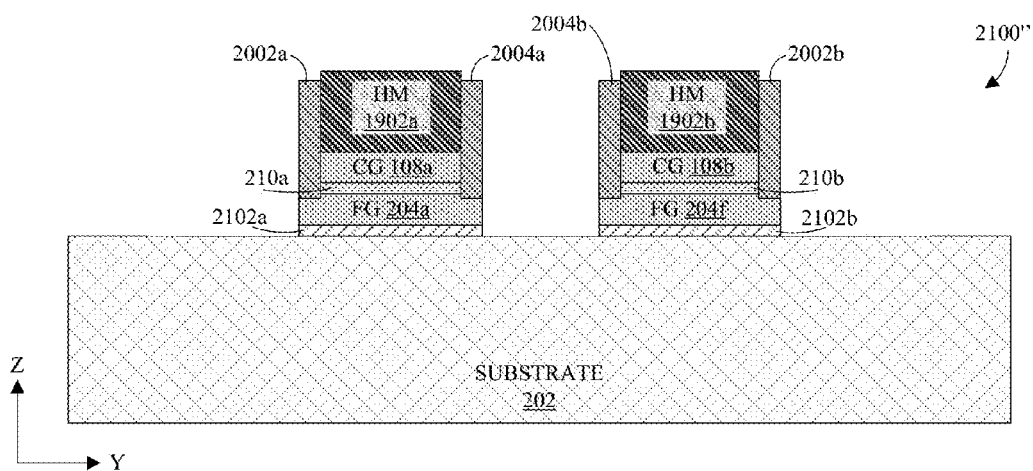

FIGS. 21 A & B illustrate cross-sectional views 2100', 2100", respectively, of some embodiments corresponding to Action 532. As shown by FIGS. 21A & B, a sixth etch is performed through the remaining first conductive layer 1302' and the remaining first dielectric layer 702' to form floating gates 204a, 204f-j resting atop gate dielectrics 2102a, 2102b.

Figure 22A:
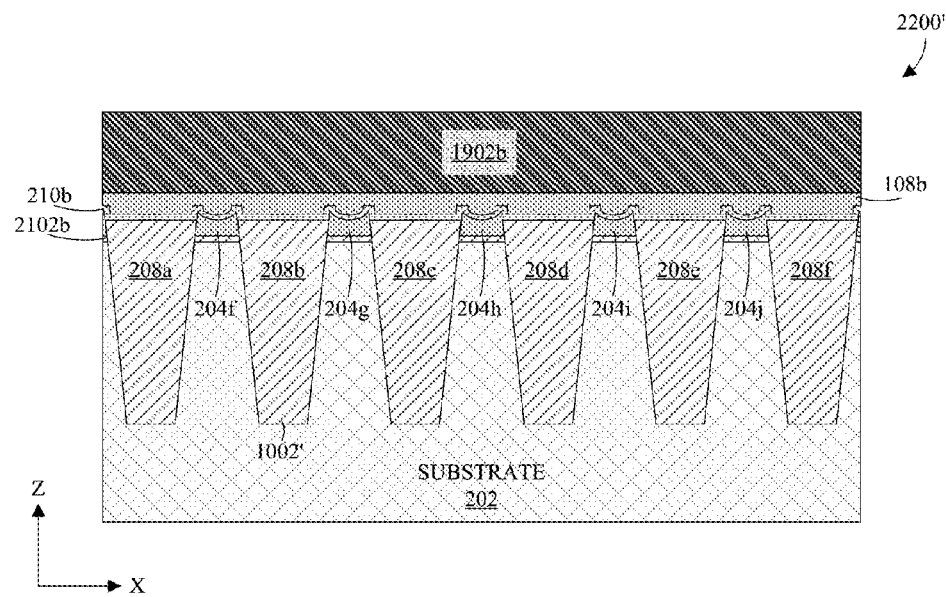
FIGS. 22A & B respectively illustrate cross-sectional views of some embodiments of the semiconductor structure of FIG. 1 at a stage of manufacture, the cross-sectional views respectively along lines A-A' and B-B' of FIG. 1.
Figure 22B:
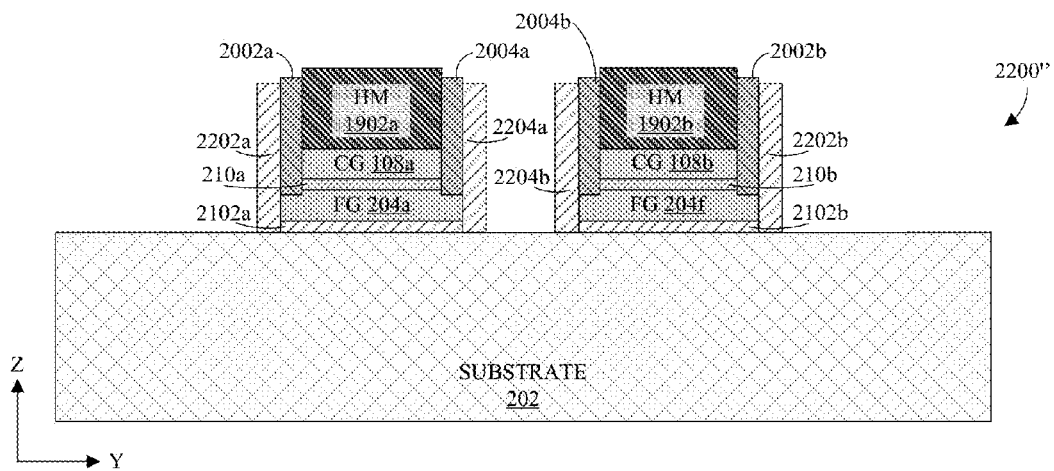

FIGS. 22 A & B illustrate cross-sectional views 2200', 2200", respectively, of some embodiments corresponding to Action 534. As shown by FIGS. 22A & B, first peripheral liners 2202a, 2202b and first central liners 2204a, 2204b are formed along opposing sidewalls of each floating gate 204 and along corresponding sidewalls of the spacers 2002, 2004. The opposing sidewalls of a floating gate 204 upon which the first liners 2202, 2204 are formed face a central region between the floating gate 204 and a peripheral region on the opposite side of the floating gate 204 as the central region, respectively. The first liners 2202, 2204 of a floating gate 204 extend from the semiconductor substrate 202, along the sidewalls of the floating gate 204 and the spacers 2002, 2004, to approximately even with a top surface of the hard mask 1902. In some embodiments, the first liners 2202, 2204 are formed by conformally forming an intermediate dielectric layer over sidewalls of the floating gates 204 and the spacers 2002, 2004, over the hard masks 1902, and over the semiconductor substrate 202. Typically, the intermediate dielectric layer is an oxide dielectric formed by high temperature oxide (HTO) deposition. An etch is then performed through the intermediate dielectric layer to remove portions of the intermediate dielectric layer that line or are otherwise formed on a horizontal surface of the semiconductor substrate 202 and, in some embodiments, the hard masks 1902.

Figure 23A:
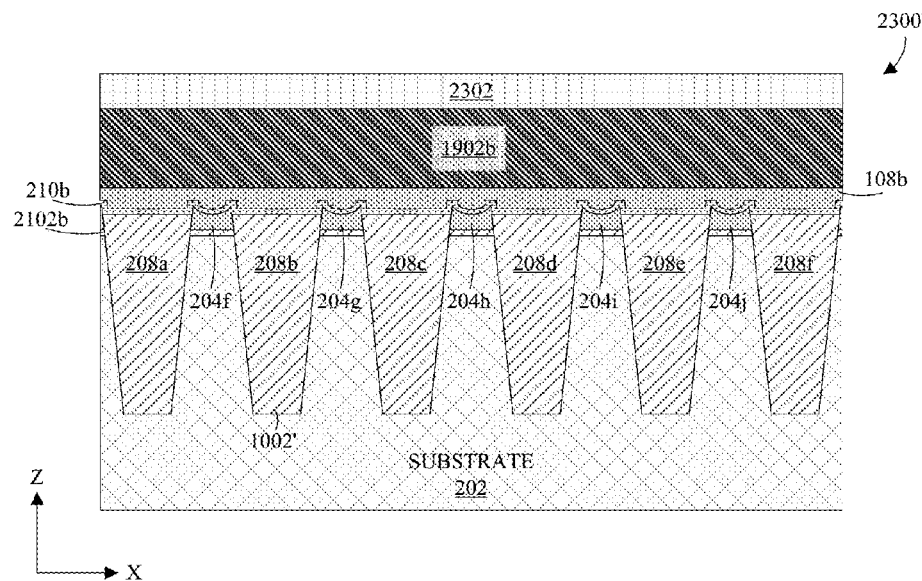
FIGS. 23A & B respectively illustrate cross-sectional views of some embodiments of the semiconductor structure of FIG. 1 at a stage of manufacture, the cross-sectional views respectively along lines A-A' and B-B' of FIG. 1.
Figure 23B:
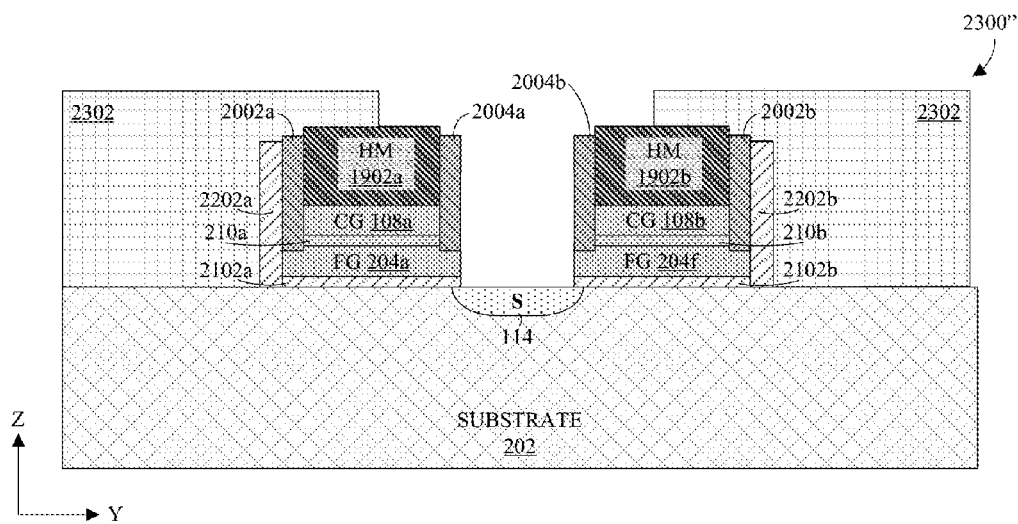

FIGS. 23 A & B illustrate cross-sectional views 2300', 2300", respectively, of some embodiments corresponding to Action 536. As shown by FIGS. 23A & B, a shared source/drain region 114 is embedded within the surface of the semiconductor substrate 202 between the control gates 108. In some embodiments, the embedding is performed by masking peripheral regions of the semiconductor structure (i.e., those regions outside a central region between the control gates 108) with a photoresist 2302. Thereafter, the first central liners 2204 are removed, and ions (e.g., n+ ions) are implanted into the semiconductor substrate 202 to form the shared source/drain region 114 with a predefined thickness, such as 20 A. With the shared source/drain region 114 embedded, the photoresist is removed. The shared source/drain region 114 may be of an opposite type as the semiconductor substrate 202 or of an opposite type as a well region or active region in which the split gate flash memory cells 104 are formed.

Figure 24A:
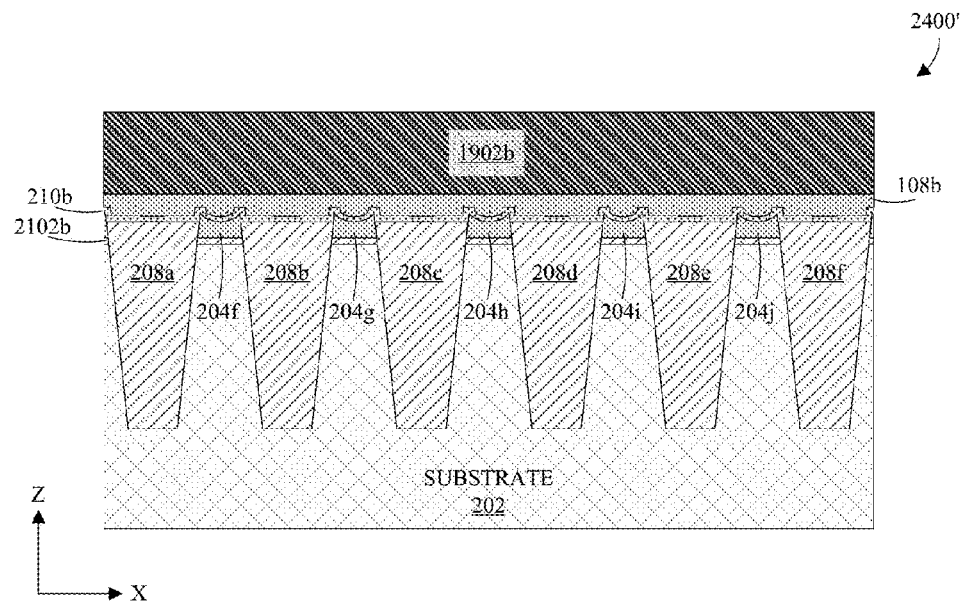
FIGS. 24A & B respectively illustrate cross-sectional views of some embodiments of the semiconductor structure of FIG. 1 at a stage of manufacture, the cross-sectional views respectively along lines A-A' and B-B' of FIG. 1.
Figure 24B:
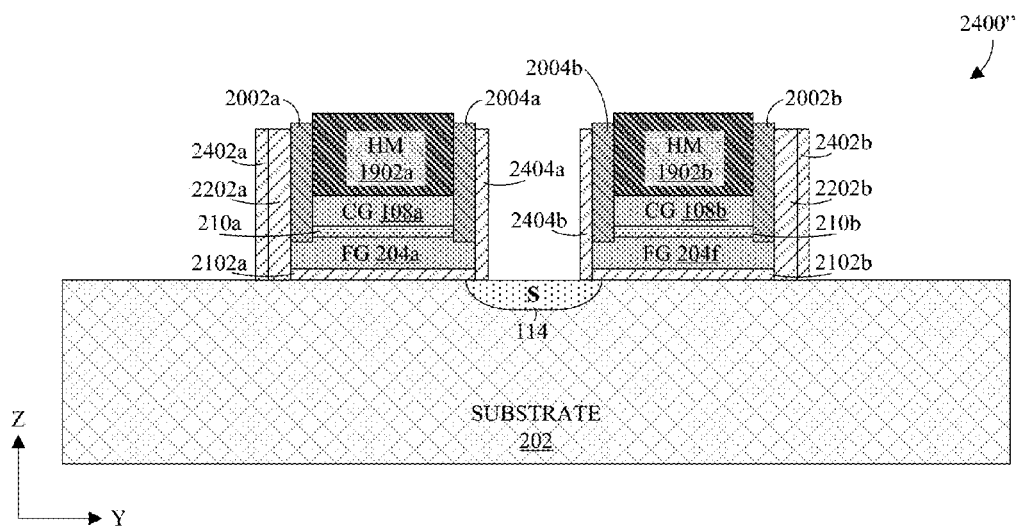

FIGS. 24 A & B illustrate cross-sectional views 2400', 2400", respectively, of some embodiments corresponding to Action 538. As shown by FIGS. 24A & B, second peripheral liners 2402a, 2402b and second central liners 2404a, 2404b are formed along opposing sides of each floating gate 204. The opposing sides of a floating gate 204 upon which the second liners 2402, 2404 are formed face a central region between the floating gates 204 and a peripheral region on the opposite side of the control gate 108 as the central region, respectively. The second peripheral liner 2402 of a floating gate 204 extends from the semiconductor substrate 202, along a sidewall of the corresponding first peripheral liner 2202, to approximately even with a top surface of the hard mask 1902. The second central liner 2404 of a floating gate 204 extends from the semiconductor substrate 202, along a sidewall of the floating gate 204 and the central spacer 2004, to approximately even with a top surface of the hard mask 1902. In some embodiments, the second liners 2402, 2404 are formed by conformally forming an intermediate dielectric layer over the semiconductor structure. An etch is then performed through the intermediate dielectric layer to remove portions of the intermediate dielectric layer that line or are otherwise formed on a horizontal surface of the semiconductor substrate 202 and, in some embodiments, the hard masks 1902.

Figure 25A:
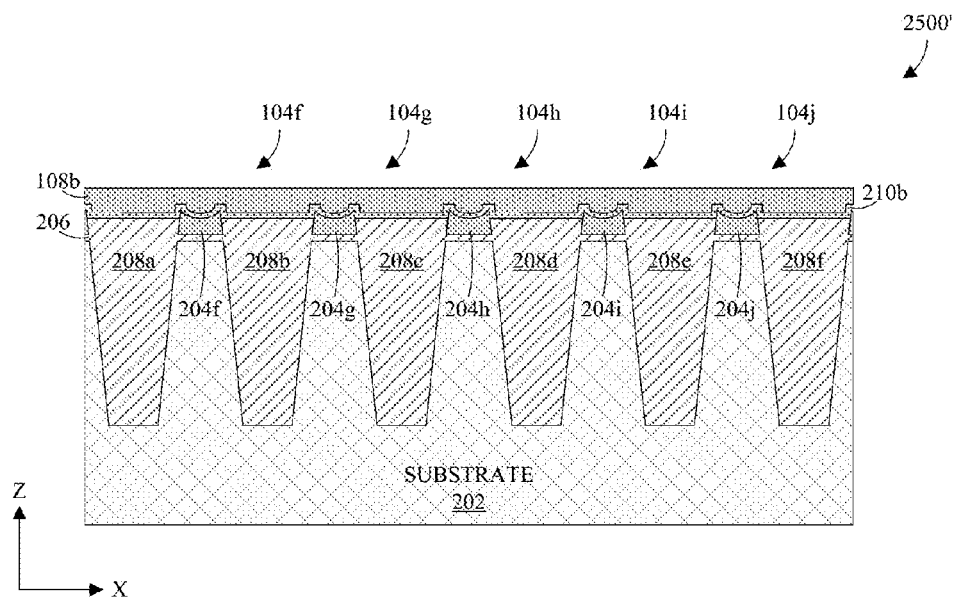
FIGS. 25A & B respectively illustrate cross-sectional views of some embodiments of the semiconductor structure of FIG. 1 at a stage of manufacture, the cross-sectional views respectively along lines A-A' and B-B' of FIG. 1.
Figure 25B:
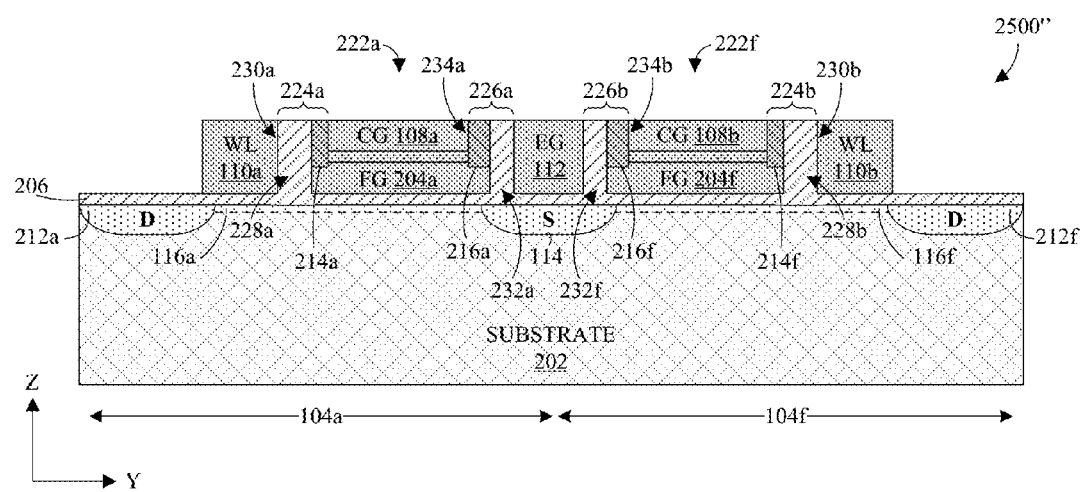

FIGS. 25A & B illustrate cross-sectional views 2500', 2500", respectively, of some embodiments corresponding to Actions 540-544. Of note, FIGS. 25A & B do not discriminate between adjoining layers of the same material type (e.g., oxide). As shown by FIGS. 25A & B, an erase gate 112 is formed in central region between the control gates 108 over the shared source/drain region 114, and word lines 110a, 110b are formed at the periphery of the semiconductor structure adjacent to the floating gates 204. Further, a third planarization is performed down to the control gates 108.

Also shown in FIGS. 25A & B, two individual source/drain regions 212a, 212f are embedded at the periphery of the semiconductor structure adjacent to the word lines 110 (i.e., outside a central region between the control gates 108). Typically, the individual source/drain regions 212 are embedded after the word lines 110 are formed. In some embodiments, the individual source/drain regions 212 are embedded by masking a central region between the control gates 108 with a photoresist. Thereafter, ions (e.g., n+ ions) of the same type as the shared source/drain region 114 are implanted into the semiconductor substrate 202 to form the individual source/drain regions 212 with a predefined thickness, such as 20 A. The shared and individual source/drain regions 114, 212 are spaced apart with the shared source/drain region 114 in the middle of the two individual source/drain regions 212. Further, each individual source/drain region 212 and the shared source/drain region 114 define a channel region 116a, 116f therebetween.

Thus, as can be appreciated from above, the present disclosure provides a semiconductor structure of a split gate flash memory cell. The semiconductor structure includes a semiconductor substrate having a first source/drain region and a second source/drain region. The semiconductor structure further includes an erase gate located over the first source/drain region, and a floating gate and a word line located over the semiconductor substrate between the first and second source/drain regions. The floating gate is arranged between the word line and the erase gate. Further, the floating gate includes a pair of protrusions extending vertically up from a top surface of the floating gate and arranged on opposing sides, respectively, of the floating gate.

In other embodiments, the present disclosure provides a method of manufacturing a semiconductor structure of a split gate flash memory cell. A semiconductor substrate is received, and a floating gate is formed over the semiconductor substrate. The floating gate is formed to include a pair of protrusions extending vertically up from a top surface of the floating gate and arranged on first opposing sides, respectively, of the floating gate. A word line and an erase gate are formed on second opposing sides of the floating gate.

In yet other embodiments, the present disclosure provides a semiconductor structure of split gate flash memory cells. The semiconductor structure includes a semiconductor substrate including a first pair of source/drain regions, a second pair of source/drain regions, and an isolation region arranged between the first and second pairs of source/drain regions. The semiconductor structure further includes a first erase gate located over a source/drain region of the first pair, and a second erase gate located over a source/drain region of the second pair. Even more, the semiconductor structure includes a first word line and a first floating gate located over the semiconductor substrate between the source/drain regions of the first pair. The first floating gate is arranged between the first word line and the first erase gate. Further, the first floating gate includes a pair of protrusions extending vertically up from a top surface of the first floating gate and arranged on opposing sides, respectively, of the first floating gate. Moreover, the semiconductor structure includes a second word line and a second floating gate located over the semiconductor substrate between the source/drain regions of the second pair. The second floating gate is arranged between the second word line and the second erase gate. Further, the second floating gate includes a pair of protrusions extending vertically up from a top surface of the second floating gate and arranged on opposing sides, respectively, of the second floating gate. One of the opposing sides of each floating gate faces the isolation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure of a split gate flash memory cell, said semiconductor structure comprising:
a semiconductor substrate including a first source/drain region and a second source/drain region;
an erase gate located over the first source/drain region; and
a floating gate and a word line located over the semiconductor substrate between the first and second source/drain regions, wherein the floating gate is arranged between the word line and the erase gate, and wherein the floating gate includes a pair of protrusions extending vertically up from a top surface of the floating gate and arranged on opposing sides, respectively, of the floating gate.

2. The semiconductor structure according to claim 1, wherein the pair of protrusions extend vertically up about 20-180 Angstroms (A) from a planar interface between the protrusions and a base region of the floating gate.

3. The semiconductor substrate according to claim 1, wherein each protrusion extends between the word line and the erase gate.

4. The semiconductor structure according to claim 1, wherein the floating gate includes a base region and a protrusion region atop the base region, the protrusion region including the protrusions, and the base region having the profile of an isosceles trapezoid increasing in width towards the semiconductor structure.

5. The semiconductor structure according to claim 1, wherein each protrusion culminates in a point or tip on a corresponding one of the opposing sides.

6. The semiconductor structure according to claim 5, wherein the protrusions each include a sidewall arcing gradually with increasing slope to the point or tip.

7. The semiconductor structure according to claim 5, wherein the protrusions each include a sidewall intersecting the point or tip and running coplanar with a sidewall of a base region of the floating gate, the protrusion extending from a top surface of the base region.

8. The semiconductor structure according to claim 1, further including:
a control gate arranged over the floating gate; and
an inter-gate dielectric region arranged between the control gate and the floating gate, the inter-gate dielectric region conformally lining the protrusions.

9. The semiconductor structure according to claim 1, wherein the semiconductor substrate further includes a third source/drain region, wherein the second source/drain region is arranged between the first and third source/drain regions, and wherein the semiconductor structure further includes:
a second floating gate and a second word line located over the semiconductor substrate between the second and third source/drain regions, wherein the second floating gate is arranged between the second word line and the erase gate, and wherein the second floating gate includes a pair of protrusions extending vertically up from a top surface of the second floating gate and arranged on opposing sides, respectively, of the second floating gate.

10. A method of manufacturing a semiconductor structure of a split gate flash memory cell, said method comprising:
receiving a semiconductor substrate;
forming over the semiconductor substrate a floating gate including a pair of protrusions extending vertically up from a top surface of the floating gate and arranged on first opposing sides, respectively, of the floating gate; and
forming a word line and an erase gate on second opposing sides of the floating gate.

11. The method according to claim 10, further including:
forming the floating gate using a dry etch with an etch recipe comprising primarily hydrogen bromide (HBr) and oxygen.

12. The method according to claim 10, forming the protrusions to each extend between the second opposing sides.

13. The method according to claim 10, further including:
receiving a semiconductor structure having a first conductive layer embedded within a top, planar surface of a first dielectric layer arranged over the semiconductor substrate;
forming a recess in the first conductive layer by performing a first, dry etch of the semiconductor structure using an etch recipe that preferentially removes the first conductive layer while leaving the first dielectric layer; and
forming the pair of protrusions by recessing the first dielectric layer relative to the remaining first conductive layer.

14. The method according to claim 13, further including:
forming the recess with a depth of about 20-180 Angstroms (A).

15. The method according to claim 13, further including:
forming the recess with a dry etch recipe comprising primarily hydrogen bromide (HBr) and oxygen.

16. The method according to claim 15, further including:
forming the recess by diluting the etch recipe with helium (He) and argon (Ar) gases.

17. The method according to claim 13, further including:
forming the recess to arc between the first opposing sides.

18. The method according to claim 13, further including:
forming a second dielectric layer conformally lining the remaining first conductive layer, including the protrusions;
forming a second conductive layer over the second dielectric layer; and
forming a control gate by performing a second etch through the second conductive layer, the second dielectric layer, and partially into the first conductive layer.

19. The method according to claim 18, further including:
forming spacers on opposing sides of the control gate corresponding to the second opposing sides; and
forming the floating gate by performing a third etch through exposed portions of the remaining first conductive layer.

20. A semiconductor structure of split gate flash memory cells, said semiconductor structure comprising:
a semiconductor substrate including a first pair of source/drain regions, a second pair of source/drain regions, and an isolation region arranged between the first and second pairs of source/drain regions;
a first erase gate located over a source/drain region of the first pair;
a first word line and a first floating gate located over the semiconductor substrate between the source/drain regions of the first pair, wherein the first floating gate is arranged between the first word line and the first erase gate, and wherein the first floating gate includes a pair of protrusions extending vertically up from a top surface of the first floating gate and arranged on opposing sides, respectively, of the first floating gate;
a second erase gate located over a source/drain region of the second pair; and
a second word line and a second floating gate located over the semiconductor substrate between the source/drain regions of the second pair, wherein the second floating gate is arranged between the second word line and the second erase gate, and wherein the second floating gate includes a pair of protrusions extending vertically up from a top surface of the second floating gate and arranged on opposing sides, respectively, of the second floating gate;
wherein one of the opposing sides of each floating gate faces the isolation region.

* * * * *